United States Patent
Tanaka et al.

(10) Patent No.: US 7,924,089 B2
(45) Date of Patent: Apr. 12, 2011

(54) OFFSET VOLTAGE CORRECTION CIRCUIT AND CLASS D AMPLIFIER

(75) Inventors: Yasuomi Tanaka, Hamamatsu (JP); Nobuaki Tsuji, Hamamatsu (JP); Hirotaka Kawai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/807,162

(22) Filed: Aug. 30, 2010

(65) Prior Publication Data
US 2011/0006843 A1    Jan. 13, 2011

Related U.S. Application Data

(62) Division of application No. 11/825,530, filed on Jul. 6, 2007, now Pat. No. 7,816,992.

(30) Foreign Application Priority Data

Jul. 7, 2006    (JP) .................................. 2006-188624
Jul. 7, 2006    (JP) .................................. 2006-188657

(51) Int. Cl.
*H03F 3/38* (2006.01)
(52) U.S. Cl. ............................................. 330/10; 330/9
(58) Field of Classification Search .................. 330/9, 10, 330/51, 207 A, 251
See application file for complete search history.

(56) References Cited

U.S. PATENT DOCUMENTS

| | | | |
|---|---|---|---|
| 4,717,888 A | 1/1988 | Vinn et al. |
| 4,806,875 A | 2/1989 | Schaffer |
| 5,061,900 A | 10/1991 | Vinn et al. |
| 5,548,241 A | 8/1996 | McClure |
| 5,550,512 A | 8/1996 | Fukahori |
| 5,812,005 A | 9/1998 | Ezell et al. |
| 6,114,907 A | 9/2000 | Sakurai |
| 7,095,275 B2 | 8/2006 | Miyazaki |
| 7,167,046 B2 | 1/2007 | Maejima |

FOREIGN PATENT DOCUMENTS

| | | |
|---|---|---|
| JP | 59-144209 | 8/1984 |
| JP | 02-185106 | 7/1990 |
| JP | 6-41382 | 10/1994 |
| JP | 08-037430 | 6/1996 |
| JP | 09-246885 | 9/1997 |

(Continued)

OTHER PUBLICATIONS

Japanese Patent Office "Notification of Reasons for Refusal" Japanese Patent Application No. 2006-188624, Drafting Date Jun. 6, 2008, 2 pages.

(Continued)

*Primary Examiner* — Robert Pascal
*Assistant Examiner* — Khiem D Nguyen
(74) *Attorney, Agent, or Firm* — Pillsbury Winthrop Shaw Pittman LLP

(57) ABSTRACT

A class D amplifier includes an input unit that inputs an input signal and an integrator which includes a differential operational amplifier having an offset voltage correction function. The integrator integrates the input signal input. A pulse-width modulator modulates the integration result of the integrator to generate a pulse signal having a pulse width reflective of the integration result. An output unit outputs the pulse signal. A feedback unit superimposes a signal output from the output unit on the input signal and feeds back the superimposed signal to the integrator. An input controller selectively set the input unit to a state where no signal is input. An output controller sets a voltage of an output from the feedback unit to a constant voltage.

6 Claims, 11 Drawing Sheets

FOREIGN PATENT DOCUMENTS

| | | |
|---|---|---|
| JP | 2000-183671 | 6/2000 |
| JP | 2004120102 | 4/2004 |
| JP | 2004527179 T | 9/2004 |
| JP | 2006042296 | 2/2006 |
| KR | 20050001317 | 1/2005 |
| WO | WO 02/087073 A2 | 10/2002 |

OTHER PUBLICATIONS

Japanese Patent Office "Notification of Reasons for Refusal" Japanese Patent Application No. 2006-188657, Drafting Date Jul. 4, 2008, 2 pages.

Korean Patent Office "Notice of Preliminary Rejection" Patent Application No. 10-2007-0068310, Issued Sep. 29, 2008, 4 pages.

Japanese Patent Office "Notification of Reasons for Refusal" Japanese Patent Application No. 2006-188624, Drafting Date Jan. 20, 2009, 3 pages.

Japanese Patent Office "Notification of Reasons for Refusal" Japanese Patent Application No. 2006-188624, Drafting Date Sep. 11, 2009, 3 pages.

Japanese Patent Office "Notification of Reasons for Refusal" Japanese Patent Application No. 2006-188624, Drafting Date Jun. 14, 2010, 2 pages.

PRIOR ART

OFFSET VOLTAGE CORRECTION CIRCUIT AND CLASS D AMPLIFIER

RELATED APPLICATIONS

This application is a divisional of application Ser. No. 11/825,530, filed Jul. 6, 2007, now U.S. Pat. No. 7,816,992, which claims priority from Japanese application Nos. 2006-188624 and 2006-188657, both filed Jul. 7, 2006, the disclosures of all the foregoing being incorporated herein by reference.

BACKGROUND OF THE INVENTION

The present invention relates to a circuit technique for correcting an offset voltage of a differential amplifier having a pair of differential transistors, as well as to a circuit technique for correcting an offset voltage of a class D amplifier.

The differential amplifier generally has an offset voltage. Even when two input signals have the same voltage (i.e., a difference between the two input signals is zero), an output signal assumes a value differing from an ideal value. The reason for this is that each of the transistors constituting the differential amplifier has various factors of property variations attributable to variations in a threshold value, or the like.

A known related-art technique for correcting such an offset voltage of the differential amplifier is an offset voltage correction circuit which causes an electric current to flow into one of a differential pair of transistors constituting the differential amplifier, thereby correcting the offset voltage (see JP-A-8-256025).

FIG. 10 is a circuit diagram of a differential amplifier having the above related-art offset voltage correction circuit. In the drawing, reference numerals 500 and 501 designate NMOS transistors constituting a differential pair of differential amplifiers; 502 and 503 designate PMOS transistors constituting load on the differential amplifiers; 504 designates a bias current source for the differential amplifier; 505 designates a current source for correcting an offset voltage (hereinafter called an "offset voltage correction current source"); INP and INN denote input terminals of the differential amplifier; and OUTP denotes an output terminal of the differential amplifier.

A known differential amplifier is constituted of the NMOS transistors 500 and 501, the PMOS transistors 502 and 503, and the constant current source 504 for biasing purpose. One end of the offset voltage correction current source 505 is connected to a drain of the NMOS transistor 500, and the other end of the same is connected to a power source VDD. The offset voltage correction current source 505 serves as causing an electric current to flow to the drain of the NMOS transistor 500.

The principle of operation for correcting an offset voltage will be described hereunder. In order to facilitate comprehension of a working effect yielded by the principle, the NMOS transistors 500 and 501 and the PMOS transistors 502 and 503 are assumed not to have property variations responsible for an offset voltage.

Under such hypothetical conditions, consideration is first given to a steady state where a single DC bias voltage Vi is applied to both input terminals INP and INN and where the offset voltage correction current source 505 assumes a current value of zero. In this state, provided that an electric current flowing through the NMOS transistor 500 is taken as IA; that an electric current flowing through the NMOS transistor 501 is taken as IB; and a current value of the constant current source 504 is taken as It, we have IA=IB=It/2.

Next, consideration is given to a case where the current value of the offset voltage correction current source 505 is ios. In this case, provided that mutual conductance of the NMOS transistor 500 is taken as gmn, the current ios is added to a steady-state current flowing through the NMOS transistor 500, and an input-equivalent offset voltage vosi (=ViA−ViB) originating from the current ios is expressed by $$vosi = ios/gmn \quad (1).$$

From Expression (1), it is understood that the electric current ios is caused to flow into one of the MOS transistors constituting the differential pair, whereby a voltage vosi is acquired as an input-equivalent offset voltage corresponding to the amount of electric current. Consequently, even when the differential amplifier is not ideal and previously has an offset voltage, the offset voltage can be corrected by adjusting the current ios.

However, according to the offset voltage correction circuit of the related art, a very small current value is required for a correction current, and difficulty is encountered in acquiring such a small current value with accuracy. Therefore, accurate adjustment of the offset voltage cannot be carried out. For instance, when an input-equivalent offset voltage of vosi=50 [μV] is acquired, the current must be set to ios=0.1 [μA] on the assumption that gmn=2 [mS]. When the mutual conductance gm of the NMOS transistors 500 and 501 is much smaller, the correction current must be set to a much smaller value in order to acquire the same input-equivalent offset voltage.

Moreover, when the mutual conductance has changed for reasons of environmental variations such as process variations, there arises a problem of the input-equivalent offset voltage greatly changing according to Expression (1) because the input-equivalent offset voltage exhibits high sensitivity to the mutual conductance.

Incidentally, a class D amplifier for amplifying power by converting an analogue signal, such as a music signal, into a pulse signal has hitherto been known.

FIG. 11 shows a related-art class D amplifier. Analog input signals AIN(+) and AIN(−), which are of opposite polarities, are applied from an external signal source to the input terminals INP and INM. These analog input signals AIN(+) and AIN(−) are input to input terminals T11 and T12 of the class D amplifier by way of capacitors Cin 1 and Cin 2. After having been input to the class D amplifier, the signal is input to and amplified by an input stage amplifying circuit 100, and the thus-amplified signal is input subsequently to an integration circuit 110. A pulse width modulation (PWM) circuit 120 pulse-width modulates a signal output from the integration circuit 110.

An output buffer 1300 outputs complementary pulse signals OUTP and OUTM in accordance with a signal output from the pulse width modulation circuit 120. These pulse signals OUTP and OUTM are returned through feedback to an input side of a differential amplifier 114 constituting the integration circuit 110 by way of feedback resistors R41 and R42, whereby distortion of a waveform of the pulse signal is corrected. The pulse signals OUTP and OUTM are output to the outside by way of output terminals T21 and T22 and pass through a low pass filter consisting of inductors L1, L2 and a capacitor C, to thus become an analog signal used for driving a speaker SP.

Incidentally, a popping sound induced by an offset voltage of the circuit usually arises in an amplifier for audio purpose. Likewise, even in the class D amplifier mentioned above, transistors constituting the differential operational amplifiers 101 and 114 have an offset voltage induced by variations in the process for manufacturing or the like. Even when no signal is input, a mean voltage value of the output pulse signal OUTP and a mean voltage value of the output pulse signal OUTM differ from each other. Specifically, an offset voltage is output.

In this case, since the offset voltage is applied to the speaker at all times, a popping sound is emitted from the speaker at the time of a mute or power shutoff.

In the class D amplifier shown in FIG. 11 (the differential operational amplifiers 101 and 114 do not include the previously-described offset correction circuit of the related art), there may arise a case where a source voltage of an output buffer 1300 differs from a source voltage of the integration circuit 110 and that of the input stage amplification circuit 100. For instance, consideration is given to a case where the former source voltage is 15 V and where the latter source voltage is 3.3 V.

In this case, in relation to the pulse signals OUTP and OUTM output at the time of input of no signal, a rectangular waveform having a duty ratio of 50% is output complementarily. Since the source voltage of the output buffer 1300 is 15 V, a mean voltage of the output pulse signal OUTP and a mean voltage of the output pulse signal OUTM each assume a value of 7.5 V under ideal conditions where no offset voltage exists in the differential operational amplifiers 101 and 114; where a resistance value of input resistance of positive phase side (R31) of the integrator 110 is equal to a resistance value of input resistance of a reversal phase (R32) of the same; and where a resistance value of a positive phase side (R41) of a feedback resistor and a resistance value of a reversal side (R42) of the same are also equal to each other. Therefore, a voltage difference applied across the input terminals of the speaker SP is 0 V, and no sound is emitted.

Mean voltages of the signals SA and SA output from the differential operational amplifier 101 whose source voltage is 3.3 V are 1.65 V, respectively, because the signals SA and SB are positive fed back so as to coincide with a reference voltage that is one half of the source voltage. Accordingly, 5.85 volts corresponding to a voltage difference between a mean value of the output pulse signals OUTP and OUTM and a mean value of the output signals SA and SB is applied to the feedback resistor R41 and an input resistor R31 of the integration circuit 110 and the feedback resistor R42 and an input resistor R32 of the integration circuit 110, respectively. Consequently, an electric current conforming with the sum of a resistance value of the feedback resistor R41 and a resistance value of the input resistor R31 and an electric current conforming with the sum of a resistance value of the feedback resistor R42 and a resistance value of the input resistor R32 flow from the output of the output buffer 1300 to the output of the differential operational amplifier 101.

Consideration is given to a case where a difference attributable to variations exists between the resistance value of the feedback resistor R41 and the resistance value of the feedback resistor R42. Voltages applied to the two inputs of the differential operational amplifier 114 are returned through feedback and hence are equal to each other. Since the differential operational amplifier 114 functions such that the voltage applied across the input resistor R31 and the voltage applied across the input resistor R32 become equal to each other, the electric currents flowing to the respective resistors become equal to each other.

Since the electric currents having the same value flow through the feedback resistors R41 and R42, respectively, a difference arises between a voltage drop of the feedback resistor R41 and a voltage drop of the feedback resistor R42 appears in the output of the output buffer 1300 even when the value of the input resistor R31 and the value of the input resistor R32 are equal to each other. Consequently, an offset voltage conforming with the difference between the resistance value of the feedback resistor R41 and the resistance value of the feedback resistor R42 appears in the output pulse signals OUTP and OUTM.

The offset voltage (a potential difference) in the signals SA and SB caused by the differential operational amplifier 101 is multiplied by an amplification factor (R41/R31) of a negative feedback amplifier consisting of the input resistors R31 and R32, the feedback resistors R41 and R42, the integrator 110, the pulse width modulation circuit 120, and the output buffer 1300, and the thus-amplified voltage appears at the output terminals T21 and T22. For instance, when a ratio of the resistance value R31 to the resistance value R41 is 1:20, the offset voltage having arisen in the signals SA and SB is output while being multiplied by a factor of 20. When a difference exists between the resistance value of the feedback resistor R41 and the resistance value of the feedback resistor R42, this amplification factor varies from the positive phase side to the reversal phase side, so that the offset voltage becomes much greater.

Moreover, even when a difference exists between the resistance value of the input resistor R31 and that of the input resistor R32, the offset voltage arises.

Specifically, the amplification factor (R41/R31) achieved at the positive phase side of the negative feedback amplifier constituting the class D amplifier differs from the amplification factor (R42/R32) achieved at the reversal phase side of the same for reasons of variations in resistance value or the like, the difference appears as an output offset voltage. The speaker SP is activated by the offset voltage, which becomes one cause of emission of a popping sound at the time of a mute or power shutoff.

However, even when the previously-described offset voltage correction circuit of the related art is used to eliminate the offset voltage, the offset voltage of the differential operational amplifier per se can be corrected, but there arises a problem of a failure to correct an offset voltage which arises when an input resistance value or a feedback resistance value of the class D amplifier varies from the positive phase side to the reversal phase side.

SUMMARY OF THE INVENTION

The present invention has been conceived in consideration of the circumstances and aims at providing an offset voltage correction circuit capable of suppressing fluctuations in the amount of correction of an offset voltage attributable to environmental changes and correcting an offset voltage of a differential amplifier with superior accuracy.

Another object of the present invention is to provide a class D amplifier capable of correcting an offset voltage attributable to a difference among values of resistors constituting the class D amplifier.

In order to solve the above problem, the present invention provides the following arrangements.

(1) An offset voltage correction circuit for a differential amplifier comprising:
a pair of differential transistors;
a pair of load transistors connected between outputs of the pair of differential transistors and a power source, respectively;
a voltage generator that generates a constant voltage between a source of one of the pair of load transistors and the power source for correcting an offset voltage of the differential amplifier.

(2) The offset voltage correction circuit according to (1), wherein the voltage generator comprises:
first and second resistors connected between the power source and respective sources of the pair of load transistors, respectively; and
a current supply that selectively supplies to the first and second resistors a constant current for inducing a voltage drop corresponding to the constant voltage.
(3) The offset voltage correction circuit according to (1), wherein the differential amplifier is of a full operational type.
(4) A class D amplifier comprising:
an input unit that inputs an input signal;
an integrator which includes a differential operational amplifier having an offset voltage correction function and integrates a signal input through the input unit;
a pulse-width modulator that modulates the integration result of the integrator, to generate a pulse signal having pulse width that reflects the integration result;
an output unit that outputs the pulse signal;
a feedback unit that superimposes a signal output from the output unit on the input signal and feedbacks the superimposed signal to the integrator;
an input controller that sets the input unit to a state where no signal is input; and
an output controller which sets a voltage of the output from the feedback unit to a constant voltage.
(5) The class D amplifier according to (4), wherein the constant voltage set by the output controller corresponds to a voltage output from the output unit in the state where no signal is input and where an offset voltage of the differential amplifier is corrected.
(6) The class D amplifier according to (4), wherein the output controller comprise:
an output impedance controller that controls an output impedance of the output unit to a high impedance state;
a voltage application unit that applies the constant voltage to the feedback unit; and
a signal passage controller that opens a connection between an output terminal of the output unit and one end of the feedback unit and connects the one end of the feedback unit to the voltage application unit.
(7) The class D amplifier according to (4), wherein the input controller includes a switch connected between an input resistor of the input unit and an input of the differential operational amplifier.
(8) The class D amplifier according to (4), wherein the pulse signal generated by the pulse-width modulator correspond to first and second pulse signals having duty ratios which change in a complementary manner according to the integration result of the integrator, and wherein the output unit outputs the first and second pulse signals respectively.
(9) The class D amplifier according to (4), wherein the pulse-width modulator generates a fixed signal having a predetermined fixed level as well as the pulse signal and supply the fixed signal and the pulse signal to the output unit.

According to the present invention, the source voltages of the load transistors constituting the differential amplifier are controlled by resistors and an electric current, thereby changing an offset voltage correction current value. Accordingly, an offset voltage can be imparted to the differential amplifier with superior accuracy. Consequently, there can be provided an offset voltage correction circuit capable of correcting an offset voltage of the differential amplifier with superior accuracy.

According to the present invention, a feedback passage is opened, and an offset voltage correction voltage is imparted to one end of a feedback resistor. Accordingly, an offset voltage attributable to a difference of resistance value in the feedback resistor or between a positive phase side and an opposite phase side of the input resistor appears in an output of the differential operational amplifier. Therefore, there can be provided a class D amplifier capable of concurrently correcting the offset voltage attributable to a difference among values of resistors constituting the class D amplifier and the offset voltage of the differential operational amplifier, by adjusting the offset voltage of the differential operational amplifier.

DETAILED DESCRIPTIONS OF PREFERRED EMBODIMENTS

Embodiments of the present invention will be described hereinbelow by reference to the drawings.

First Embodiment

Although an offset voltage correction circuit of the present invention can be generally applied to a differential amplifier, the offset voltage correction circuit of the present embodiment is applied to a differential-input-and-differential-output amplifier (a full-differential-type amplifier).

Figure 1:
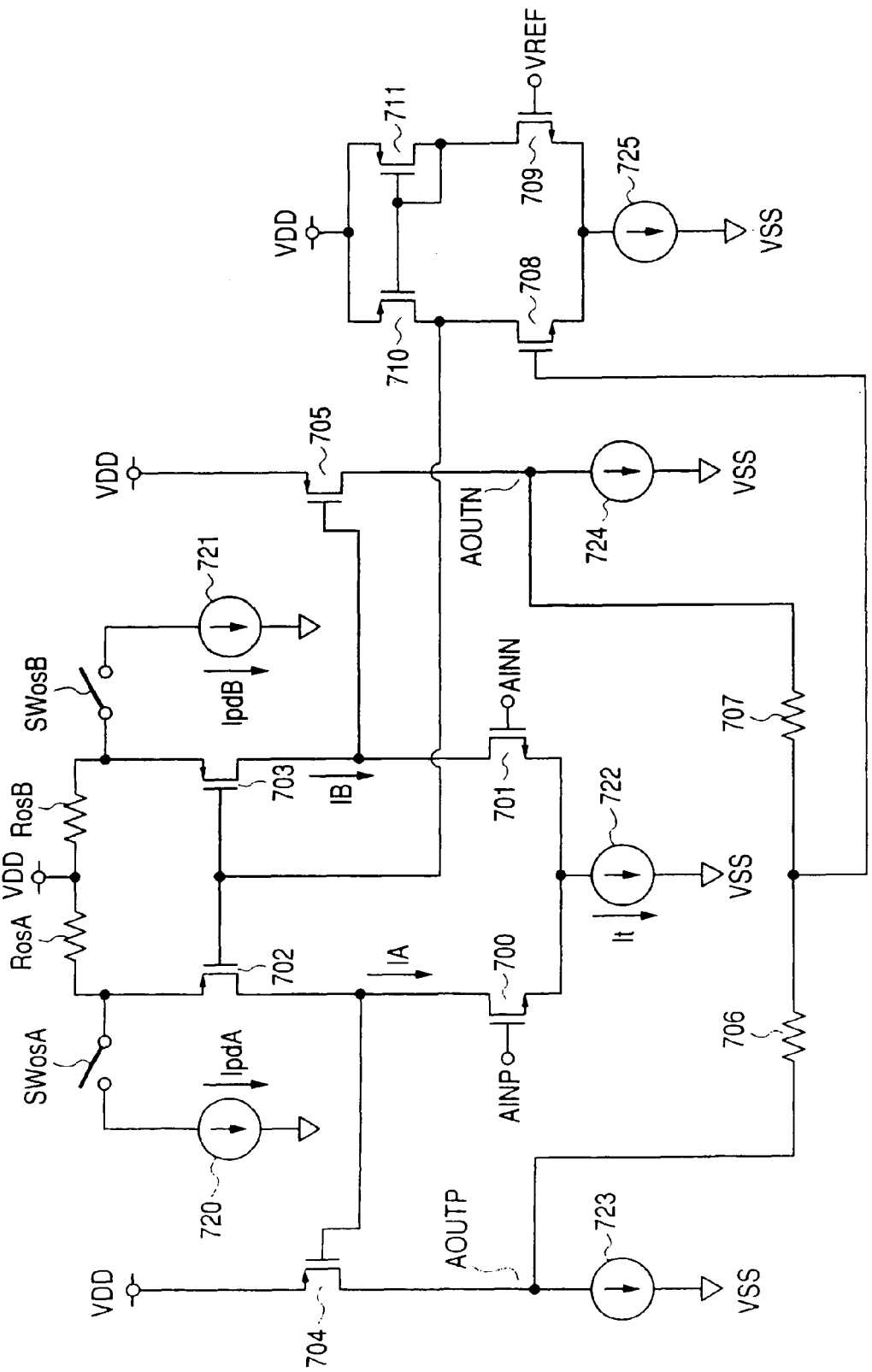
FIG. 1 is a circuit diagram of a differential-operational amplifier having an offset voltage correction circuit of a first embodiment of the present invention.

FIG. 1 is a circuit diagram of a differential amplifier equipped with an offset voltage correction circuit of the present invention; namely, a view for describing the principle of the offset voltage correction circuit.

In the drawing, reference numerals 700 and 701 designate NMOS transistors constituting a pair of differential transistors of the differential amplifier; 702 and 703 designate PMOS transistors constituting a pair of load transistors of the differential amplifier; 704 and 705 designate PMOS transistors constituting an output stage of the differential amplifier; 706 and 707 designate in-phase feedback resistors; 708 and 709 designate NMOS transistors constituting a differential pair of in-phase feedback amplifiers; and 710 and 711 designate PMOS transistors constituting load on the in-phase feedback amplifier. Reference numerals 720 and 721 designate offset voltage correction current sources (a source voltage control mechanism); 722 designates a bias current source of the differential amplifier; 723 and 724 designate bias current sources on an output stage of the differential amplifier; 725 designates a bias current source of an in-phase feedback amplifier; RosA and RosB designate offset voltage correction resistors (a source voltage control mechanism); and SWosA and SWosB designate switches of the offset voltage correction current sources.

The offset voltage correction resistor RosA is connected between the source of the PMOS transistor 702 and a power source VDD. The offset voltage correction resistor RosB is connected between the source of the PMOS transistor 703 and the power source VDD. Specifically, one end of the offset voltage correction resistor RosA is connected to the source of the PMOS transistor 702, and the other end of the same is connected to the power source (VDD). Likewise, one end of the offset voltage correction resistor RosB is connected to the source of the PMOS transistor 703, and the other end of the same is connected to the power source (VDD).

One end of the switch SWosA is connected to the source of the PMOS transistor 702, and the other end of the same is connected to one end of the offset voltage correction current source 720. The other end of the offset voltage correction current source 720 is connected to the ground (VSS). Likewise, one end of the switch SWosB is connected to the source of the PMOS transistor 703, and the other end is connected to one end of the offset voltage correction current source 721. The other end of the offset voltage correction current source 721 is connected to the ground (VSS).

The offset voltage correction circuit of the present invention comprises the offset voltage correction resistors RosA and RosB, the switches SWosA and SWosB, and the offset voltage correction current sources 720 and 721. These elements constitute a voltage generator for generating a constant voltage, which is intended for correcting an offset voltage of the differential amplifier, between the power source VDD and the source of any one of the PMOS transistors 702 and 703 constituting the pair of load transistors.

Of these elements, the switches SWosA and SWosB and the offset voltage correction current sources 720 and 721 constitute a current supply for selectively supplying a constant current—which induces a voltage drop corresponding to the constant voltage—to the resistors RosA and RosB. The differential amplifier shown in FIG. 1 except the voltage generator and the current supply constitutes a known full-differential-type amplifier.

Operation for correcting an offset voltage of the differential amplifier performed by the offset voltage correction circuit of the present invention will now be described.

First, consideration is given to an ideal state where electrical properties of the respective MOS transistors constituting the differential amplifier do not induce an offset voltage of the differential amplifier; namely, a steady state where voltages ViA and ViB applied to input terminals AINP and AINN of the differential amplifier are equal to each other (ViA=ViB). Moreover, the current value of the bias current source 722 of the differential amplifier is assumed to be It.

First, when the switches SWosA and SWosB are deactivated, the value of an electric current flowing through the resistor RosA comes to It/2, which is one half of the current value It of the bias current 122. Therefore, a voltage drop VRosA induced by the resistor RosA is expressed as $$VRosA = RosA \cdot It/2 \quad (2).$$

Next, when only the switch SWosA is closed from the above state, the electric current originating from the offset voltage correction current source ipdA is added to the constant current It/2, and the resultant current flows to the resistor RosA. Consequently, a voltage drop VRosA' induced by the resistor RosA is expressed as $$VRosA' = RosA \cdot ipdA + RosA \cdot It/2 \quad (3).$$

Consequently, a change vosA corresponding to the voltage drop induced by the resistor RosA for reasons of the added current ipdA is expressed as follows, by taking a difference between Expression (2) and Expression (3).

$$vosA = RosA \cdot ipdA \quad (4)$$

Therefore, a voltage between the gate and source of the PMOS transistor 102 is decreased by an amount corresponding to the change vosA of the voltage drop. Consequently, the value of the electric current flowing through the PMOS transistor 102 is decreased. The change ios (=IB−IA: an offset current) in current value is expressed as follows by taking mutual conductance of the PMOS transistor 102 as gmp.

$$ios = vosA \cdot gmp \quad (5)$$

Consequently, an input-equivalent offset voltage vosi (=ViB−ViA) of the NMOS transistor 700 which induces the change ios in current value expressed by Expression (5) is expressed as follows by taking mutual conductance of the NMOS transistor 700 as gmn.

$$vosi = ios/gmn \quad (6)$$

Expression (6) is substituted into Expression (5), whereby the expression is modified as $$vosi = vosA \cdot gmp/gmn \quad (7).$$

Therefore, the input-equivalent offset voltage vosi expressed by Expression (7) can be acquired by use of this circuit. Put another way, the input-equivalent offset voltage vosi can be acquired as the amount of correction to an offset voltage by adjusting the resistance and the electric current.

Next will be provided an example where element values and current values achieved when 50 [μV] is required as the input-equivalent offset voltage vosi are specifically determined by Expression (7).

Term "gmp/gmn" in Expression (7) depends on the design of an amplifier, and generally assumes a value in the neighborhood of one. Accordingly, provided that gmp/gmn=1 is achieved, vosA=vosi·gmn/gmp=50 [μV] is derived by Expression (7). Since vosA=ipdA·RosA is achieved according to Expression (4), we have RosA=50 μ/1 μ=50 [Ω] provided that, for instance, ipdA=1 [μA].

This means that, when the differential amplifier assumes an input-equivalent offset voltage of 50 [μV], the offset voltage correction circuit can correct the offset voltage by the resistor RosA and the current ipdA, to thus equivalently eliminate an offset voltage. Moreover, so long as the resistor RosA or the current ipdA is changed, the amount of correction to an offset voltage (i.e., the magnitude of an input-equivalent offset voltage) can be changed freely.

Although the above description has mentioned the example where the offset voltage correction current is caused to arise in the resistor RosA, an input-equivalent offset voltage of opposite polarity is acquired, so long as an offset voltage correction current is caused to arise in the resistor RosB by deactivating the switch SWosA and activating the switch SWosB.

In the present invention, the offset voltage correction current sources ipdA and the resistor RosA (the source voltage control mechanism) control a source voltage of the PMOS transistor 702, whereby an offset current ios expressed by Expression (1) of the related art is acquired. A gate-source voltage of the PMOS transistor 702 is controlled by the voltage vosA determined by the resistor RosA and the current ipdA, and the offset current ios is consequently determined by ios=vosA·gmp expressed by Expression (5).

Specifically, the input-equivalent offset voltage vosi is determined by vosi=vosA·gmp/gmn expressed by Expression (7). Hence, the input-equivalent offset voltage can be controlled so as to exhibit low sensitivity as compared with the case where the offset current ios is directly imparted from the current source as in the related art.

In short, when being quantitatively considered, the input-equivalent offset voltage is expressed as vosi=500 ios according to Expression (1) in the related art (in the case of gmn=2 [mS]). In contrast, according to the present invention, vosi=50 ipd is achieved according to Expression (7) (in the case of gmp/gmn=1 and RosA=50[Ω]). Specifically, the sensitivity of the input-equivalent offset voltage of the present invention to the offset voltage correction current is one-tenth that achieved in the related art. Moreover, when Ros=5[Ω] is achieved in the present invention, vosi=5 ipd is acquired, and hence a sensitivity of one one-hundredth is achieved.

An example of the offset voltage correction current value is determined. In the offset voltage correction circuit of the present invention, an offset voltage correction current required to acquire an input-equivalent offset voltage of 50 [μV] is ipdA=1 [μA] in the case of resistance RosA=50[Ω], as mentioned previously. The offset voltage correction current can be acquired with higher accuracy as compared with the case of the related art. Moreover, provided that resistance RosA=5[Ω], a required current is ipdA=10 [μA] and is acquired with higher accuracy. Namely, a designer can freely determine a combination of the resistor RosA with the offset voltage correction current ipdA such that vosA=50 [μV] is achieved. Hence, an offset voltage correction current can be set freely.

In the present invention, an offset voltage correction current which is larger in magnitude than that employed in the related art can be used for acquiring an input-equivalent offset voltage of the same magnitude. Such a large electric current value can be acquired with higher accuracy as compared with a case where a small electric current is acquired. Accordingly, the amount of correction to an offset voltage (i.e., the input-equivalent offset voltage) can be controlled with higher accuracy.

Further, in the present invention, a small input-equivalent offset voltage can also be acquired by use of an offset voltage correction current which is larger than that employed in the related art, and hence minimum resolution of the input-equivalent offset voltage can be made small, so that the amount of correction to an offset voltage of a differential amplifier can be set with high accuracy.

In addition, the offset voltage correction circuit of the present invention exhibits lower sensitivity to process variations in the input-equivalent offset voltage. Therefore, property variations are suppressed, and the property is stabilized against the process variations. The reason for this is as follows. When process variations have arisen, the mutual conductance gm of the NMOS transistor and the mutual conductance gm of the PMOS transistor tend to vary in the same manner. Hence, as can be understood from Expression (7), gmp/gmn—which is a ratio of the mutual conductance gm of the PMOS transistor to the mutual conductance gm of the NMOS transistor—becomes substantially constant, and variations are mutually canceled. For instance, when a change has arisen in capacitance Cox of a gate oxide film, the grid-anode conductance gm of the PMOS transistor and the grid-anode conductance gm of the NMOS transistor are considered to change in the same direction and at a constant ratio. Consequently, since the value of gmp/gmn in Expression (7) does not change much, the input-equivalent offset voltage vosi corresponding to the amount of correction to an offset voltage does not change much, and variations in the input-equivalent offset voltage are suppressed. Likewise, according to the offset voltage correction circuit of the present invention, the amount of correction to an offset voltage is less susceptible to environmental changes, and the offset voltage of the differential amplifier can be corrected with high accuracy.

Next, a differential amplifier of the present embodiment equipped with an offset voltage correction circuit based on the above-mentioned principle will be described.

Figure 2:
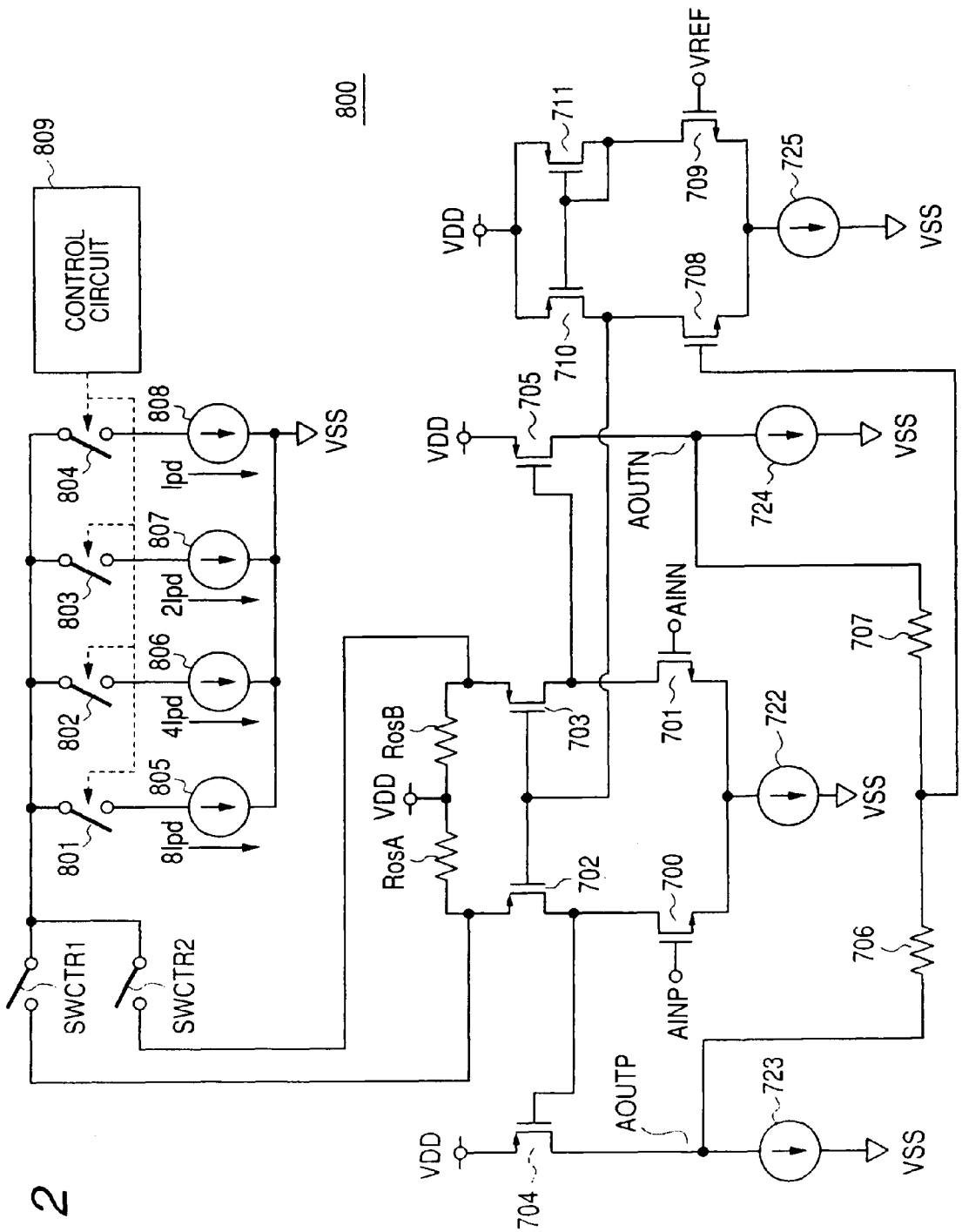
FIG. 2 is a circuit diagram of the differential operational amplifier of the embodiment having an offset voltage correction circuit equipped with a current value switching circuit.

FIG. 2 is a circuit diagram of the differential amplifier of the present embodiment.

In the drawing, reference symbols SWCTR 1 and SWCTR 2 designate switches; reference numerals 801 to 804 designate current source changeover switches; 805 to 808 designate current sources; and 809 designates a control circuit. Other differential amplifier circuits are the same as that described by reference to FIG. 1, and hence their explanations are omitted. The differential amplifier 800 is formed from the constituent elements shown in the drawing.

One end of the switch SWCTR 1 is connected to a node between the resistor RosA and the source of the PMOS transistor 702, and the other end of the same is connected to one end of the switch SWCTR 2 as well as to one end of each of the current source changeover switches 801 to 804. The other end of the switch SWCTR 2 is connected to a node between the resistor RosB and the source of the PMOS transistor 703.

The other ends of the current source changeover switches 801 to 804 are connected to ends of the current sources 805 to 808, respectively. Moreover, the other end of each of the current sources 805 to 808 is grounded.

Moreover, the control circuit 809 is connected to the current source changeover switches 801 to 804. In the illustrated example circuit, the current source changeover switches 801 to 804 are controlled between an activated state and a deactivated state by a 4-bit binary code. The MSB of the binary code controls the current source changeover switch 801, and the LSB of the same controls the current source changeover switch 804. Bits located between the MSB and the LSB sequentially control the current source changeover switches 802 and 803.

Next, operation of the differential amplification circuit of the present embodiment equipped with the offset voltage correction circuit whose offset voltage value is variable will be described.

This circuit changes electric currents flowing through the resistors RosA and RosB by switching the current source changeover switches 801 to 804 according to the respective bits of the 4-bit binary code output from the control circuit 809, thereby setting an optimum input-equivalent offset voltage value.

For instance, when the binary code output from the control circuit 809 is 0000, all of the current source changeover switches 801 to 804 are deactivated. When the binary code is 1001, the current source changeover switch 801 is activated; the switches 802 and 803 are deactivated; and the switch 804 is activated. Use of the 4-bit binary code is a mere example, and the present invention is not limited to this example.

In the current sources 805 to 808, current values are weighted. In this example, the current source 808 is assigned a current value ipd; the current source 807 is assigned a current value 2 ipd; the current source 806 is assigned a current value 4 ipd; and the current source 805 is assigned a current value 8 ipd. By adoption of such current values, the current value can be set to an arbitrary current value within a range from a minimum value of 0 to a maximum value of 15 ipd by sequentially switching the 4-bit binary code while the current value ipd is taken as the minimum unit.

When the switch SWCTR 1 is activated and the switch SWCTR 2 is deactivated, the current flows into the resistor RosA. In contrast, when the switch SWCTR 1 is deactivated and the switch SWCTR 2 is activated, the current flows into the resistor RosB. Accordingly, an offset voltage of a different polarity can be added.

The control circuit 809 controls activation and deactivation of the current source changeover switches 801 to 804. Details of a control method will be described later.

Figure 3:
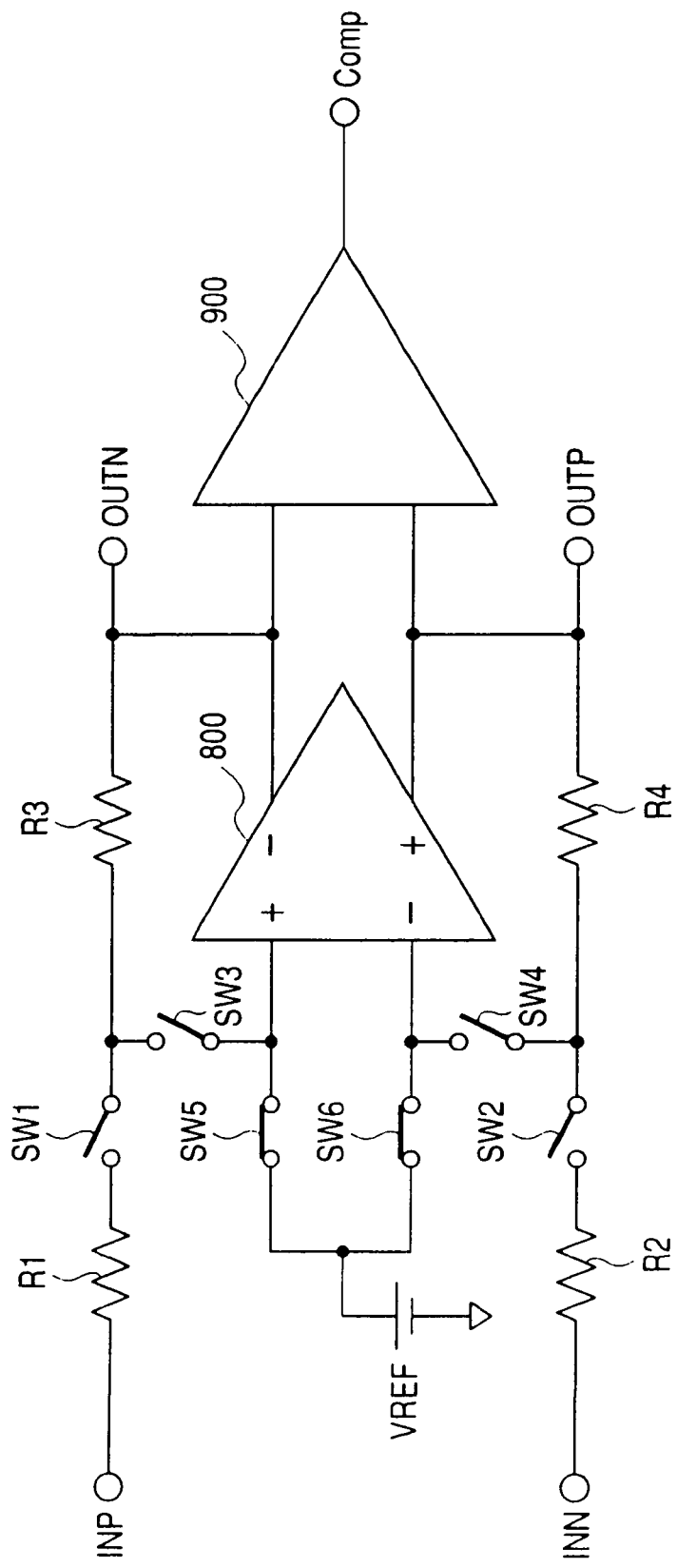
FIG. 3 is a circuit diagram of a negative feedback amplifier of the embodiment capable of correcting an offset voltage.

FIG. 3 is a circuit diagram of the negative feedback amplifier capable of correcting an offset voltage.

This negative feedback amplifier capable of correcting an offset voltage is formed from the differential amplifier 800 shown in FIG. 2.

In the drawing, reference numeral 800 designates the differential amplifier; 900 designates a comparator; R1 through R4 designate resistors; SW1 through SW6 designate switches; AINP and AINN designate input terminals of a negative feedback amplifier; AOUTP and AOUTN designate output terminals of the negative feedback amplifier; Comp designates an output terminal of a comparator; and VREF designates a reference voltage.

One noninverting input terminal of the differential amplifier 800 is connected to one end of each of the switches SW3 and SW5, and an inverting input terminal of the same is connected to one end of each of the switches SW4 and SW6. The other end of each of the switches SW5 and SW6 is connected to the reference voltage VREF. The other end of the switch SW3 is connected to one end of the switch SW1 as well as to the output terminal OUTN by way of the resistor R3.

The other end of the switch SW1 is connected to an input terminal INP by way of the resistor R1. The other end of the switch SW4 is connected to one end of the switch SW2 as well as to the output terminal OUTP by way of the resistor R4. Moreover, the other end of the switch SW2 is connected to an input terminal INN by way of the resistor R2.

One output terminal of the differential amplifier 800 is connected to the output terminal OUTP as well as to one input terminal of the comparator 900. The other output terminal of the same is connected to the output terminal OUTN as well as to the other input terminal of the comparator 900.

Next, operation of this negative feedback amplifier capable of correcting an offset voltage will be described.

First, in normal times where the amplifier operates as a negative feedback amplifier, the amplifier is used while the switches SW1 to SW4 are activated and the switches SW5 and SW6 are deactivated. In this case, the amplifier operates as a known negative feedback amplifier.

Meanwhile, at the time of correction of an offset voltage, the amplifier is used as illustrated while the switches SW1 to SW4 are activated and the switches SW5 and SW6 are activated. In this case, since a single voltage VREF is applied to two input terminals of the differential amplifier 800, voltages conforming with an offset voltage existing in the differential amplifier 800 are output from two output terminals of the differential amplifier 800. Specifically, according to the polarity of the offset voltage, the two output signals are determined such that one is larger in magnitude and the other smaller in magnitude. The comparator 900 compares these two output signals with each other, and a result of comparison is output from the output terminal Comp of the comparator.

Next will be described a method for correcting an offset voltage by use of the negative feedback amplifier circuit capable of correcting an offset voltage that has been described thus far.

Figure 4:
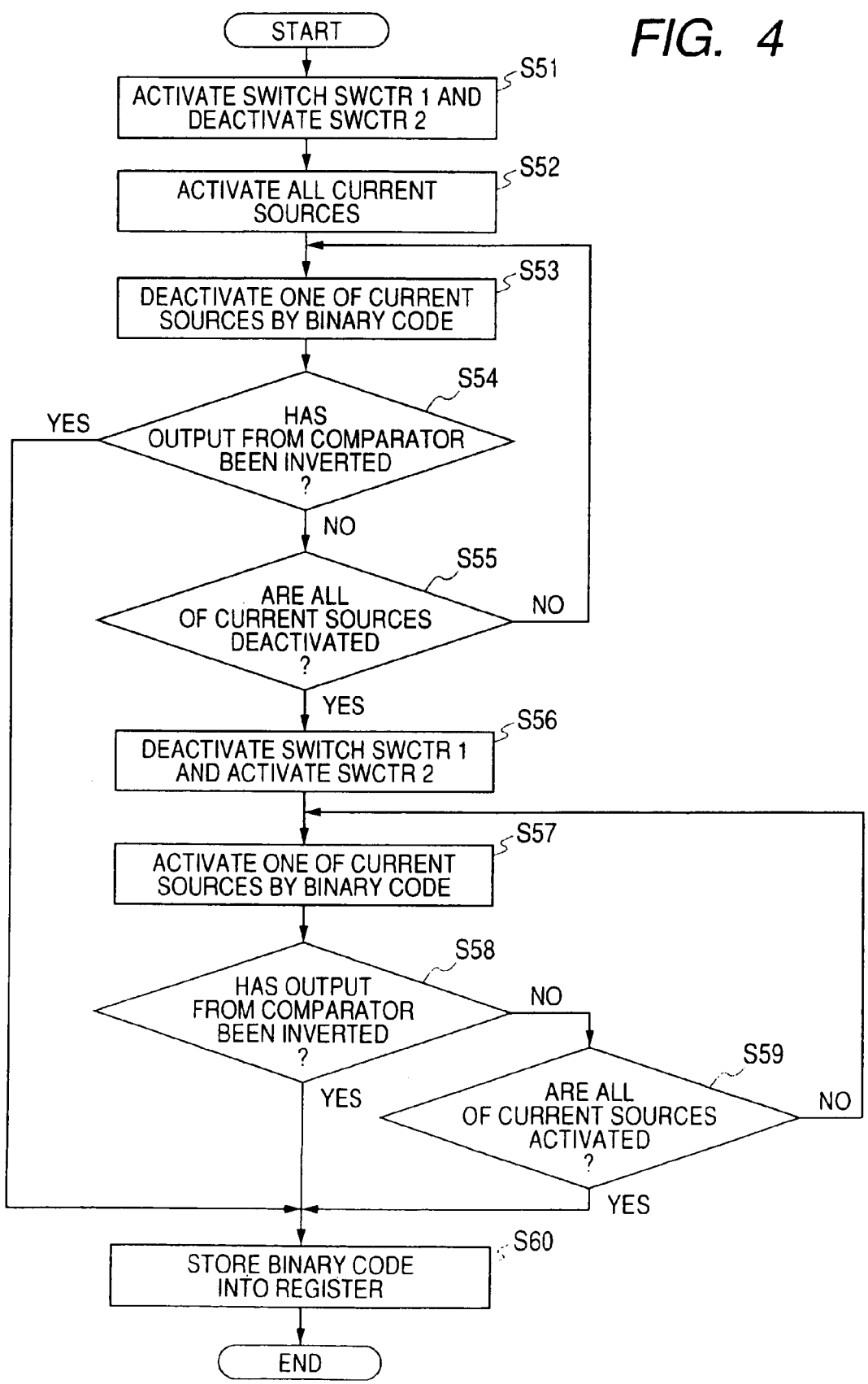
FIG. 4 is a flowchart showing the offset voltage correction method of the embodiment.

FIG. 4 is a flowchart showing the offset voltage correction method.

The switches SW1 to SW6 are set to the state shown in FIG. 3.

First, the control circuit 809 activates the switch SWCTR 1 and deactivates the switch SWCTR 2 (step S51).

Next, the control circuit 809 activates all of the current source changeover switches 801 to 804 (step S52). Specifically, in the example shown in FIG. 2, the binary code is set to 1111. The control circuit 809 then deactivates one current source changeover switch by use of the binary code (step S53). For example, when the binary code is 1111, a setting is made to 1110, and only the current source changeover switch 804 is deactivated.

Next, the control circuit 809 determines whether or not a level of a signal Comp output from the comparator 900 has been inverted (step S54). Inversion of the level of the output signal Comp signifies that the polarity of the offset voltage has been inverted. Hence, conditions for the inversion act as appropriate conditions for correcting an offset voltage.

When the level of the output signal Comp has been inverted (Yes in step S54), the control circuit 809 stores the binary code into a register (step S60), and processing is terminated. When the output signal Comp has not been inverted (No in step S54), processing proceeds to step S55.

The control circuit 809 then determines whether or not all of the current source changeover switches are deactivated (step S55). When all of the current source changeover switches are deactivated (Yes), processing proceeds to step S56. When not all of the current source changeover switches are deactivated (No), processing returns to step S53.

Next, the control circuit 809 deactivates the switch SWCTR 1 and activates the switch SWCTR 2 (step S56), whereby the offset voltage of opposite polarity can be added.

The control circuit 809 activates the current source changeover switch one time by use of the binary code (step S57). For example, in the case of a 4-bit configuration shown in FIG. 2, when the binary code is 0000, a setting is made to 0001, and only the current source changeover switch 804 is activated.

The control circuit 809 determines whether or not the level of the signal Comp output from the comparator 900 has been inverted (step S58). When the level of the output signal Comp has been inverted (Yes in step S58), the control circuit 809 stores the binary code in the register (step S60), and processing is terminated. When the level of the output signal Comp has not been inverted (No in step S58); processing proceeds to step S59.

The control circuit 809 determines whether or not all of the current source changeover switches are activated (step S59). When all of the current source changeover switches are activated (Yes), the control circuit 809 stores the binary code into the register (step S60), and processing is terminated. When not all of the current source changeover switches are activated (No), processing returns to step S57.

As mentioned above, according to the offset voltage correction circuit of the present invention, an offset voltage can be corrected optimally for each product.

Although the embodiment of the present invention has been described in detail above, a specific configuration is not limited to the embodiment. Design changes, or the like, falling within the range of gist of the present invention are also included in the present invention.

The above embodiment has described the case where the offset voltage correction circuit of the present invention is applied to the differential-input-and-differential-output amplifier using the NMOS transistor for an input and the PMOS transistor as a load. However, the offset voltage correction circuit of the present embodiment can also be applied to a differential-input-and-differential-output amplifier using a PMOS transistor for an input and an NMOS transistor as a load.

The offset voltage correction circuit of the present embodiment can also be applied to a differential-input-and-single-output amplifier.

The offset voltage correction circuit of the present embodiment can also be applied to various differential amplifiers regardless of a circuit format of the differential amplifier; for instance, a cascade amplifier, a folded cascade amplifier, or the like.

The same advantage is also yielded even when an offset voltage correction resistor is interposed between the source of each of transistors constituting a differential pair of differential amplifiers and a bias source current of each of the differential amplifiers.

Further, the same advantage can also be yielded even when a voltage drop is caused by causing an electric current to flow into the offset voltage correction resistor.

The first embodiment of the present invention has been described in detail. However, the specific configuration is not limited to the embodiment. A design change, or the like, falling within the scope of gist of the present invention is also included.

The above embodiment has described the example where the offset voltage correction circuit of the present embodiment is applied to the differential-input-and-differential-output amplifier having an NMOS transistor for an input and a PMOS transistor as a load. However, the offset voltage correction circuit of the present embodiment can also be applied to a differential-input-and-differential-output amplifier using a PMOS transistor for an input and an NMOS transistor as a load.

The offset voltage correction circuit of the present embodiment can also be applied to a differential-input-and-single-output amplifier.

Second Embodiment

Figure 5:
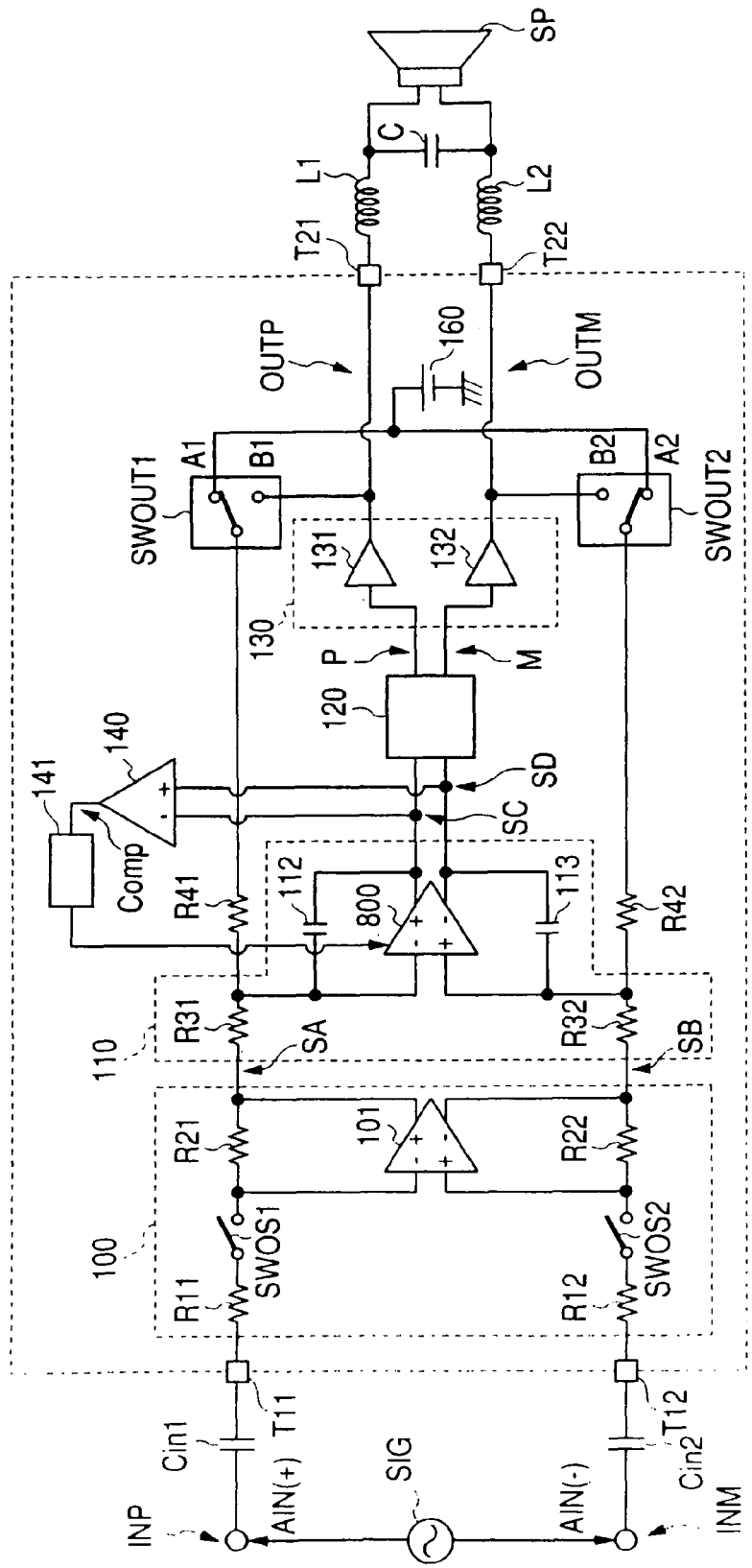
FIG. 5 is a circuit diagram of a class D amplifier according to a second embodiment of the present invention.
Figure 11:
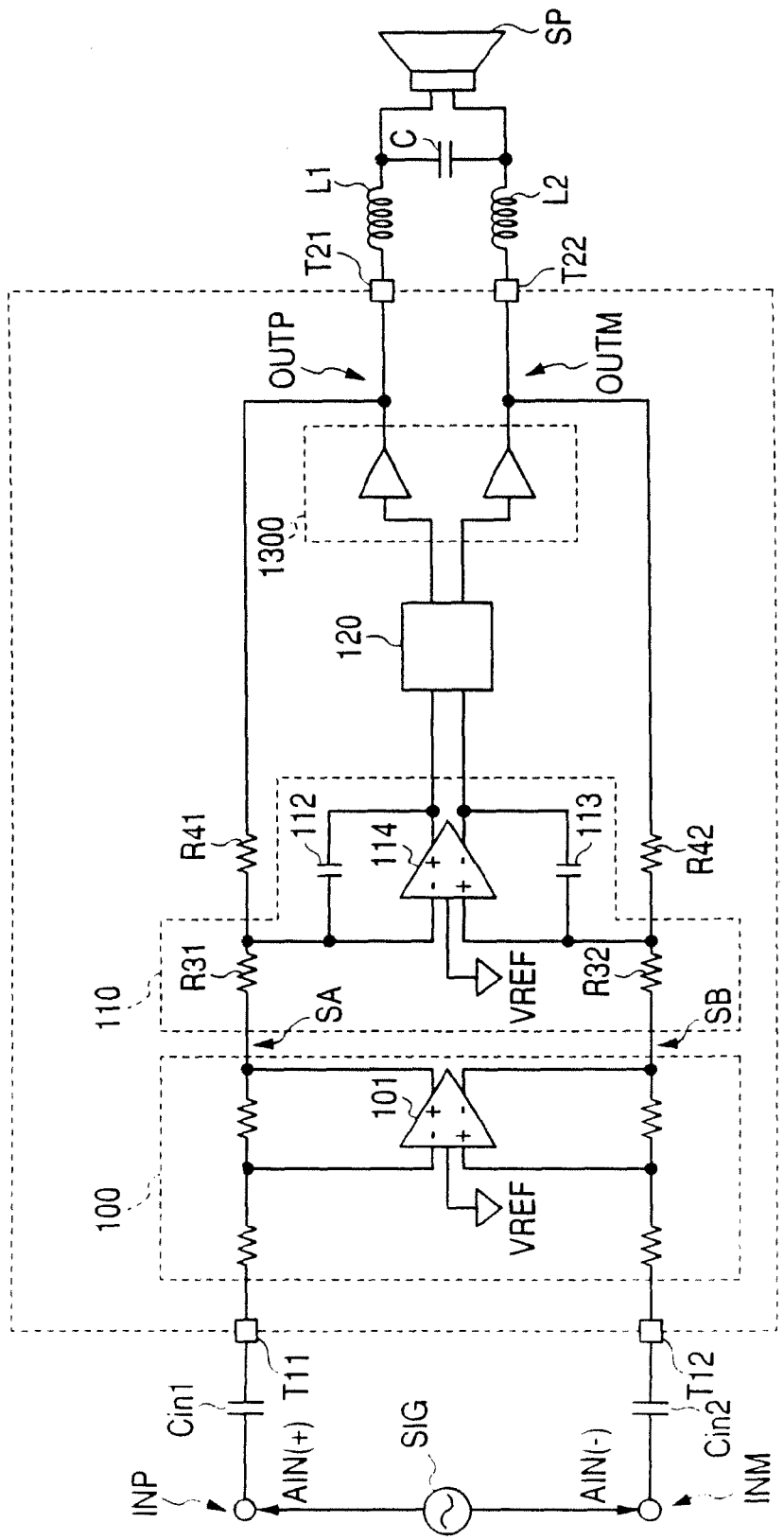
FIG. 11 is a circuit diagram of a class D amplifier of the related art.

FIG. 5 shows an example class D amplifier of a second embodiment of the present invention. The class D amplifier shown in the drawing is configured so as to modulate the pulse width of an analog input signal AIN from an external signal source SIG, to thus generate and output pulse signals OUTP and OUTM whose duty ratios change in a complementary manner in accordance with the level of the analog input signal AIN. In contrast with the configuration of the related-art class D amplifier shown in FIG. 11, the class D amplifier of the present embodiment is configured to further comprise an offset voltage correction circuit.

Specifically, the class D amplifier of the present embodiment shown in FIG. 5 comprises input terminals T11 and T12; feedback resistors R41 and R42; the input stage amplifier 100; the integration circuit 110; the pulse width modulation circuit 120 (pulse-width modulator); a drive circuit 130; a comparator 140; a control circuit 141; an offset voltage correction DC voltage source 160; switches SWOUT 1 and SWOUT 2; and output terminals T21 and T22. Analog input signals AIN(+) and AIN(−) which are opposite in polarity to each other are input to the input terminals T11 and T12 from the signal source SIG by way of the capacitors Cin 1 and Cin 2.

The input stage amplifier 100 (input unit) comprises the differential operational amplifier 101; the input resistors R11 and R12; the feedback resistors R21 and R22; and switches SWOS 1 and SWOS 2 (input controller). One end of the switch SWOS 1 is connected to an inverting input of the differential operational amplifier 101, and the other end of the switch SWOS 1 is connected to one end of the input resistor R11. The other end of the input resistor R11 is connected to the input terminal T11. One end of the switch SWOS 2 is connected to a noninverting input of the differential operational amplifier 101, and the other end of the switch SWOS 2 is connected to one end of the input resistor R12. The other end of the input resistor R12 is connected to the input terminal T12. Moreover, The feedback resistor R21 is interposed between an inverting input and a noninverting output of the differential operational amplifier 101, and the feedback resistor R22 is interposed between a noninverting input and an inverting output of the differential operational amplifier 101.

The integration circuit 110 (integrator) comprises a differential operational amplifier 800 having an offset voltage correction function, capacitors 112 and 113, and the input resistors R31 and R32. The input resistor R31 is interposed between an inverting input of the differential operational amplifier 800 having the offset voltage correction function and a noninverting output of the differential operational amplifier 101. The input resistor R32 is interposed between a noninverting input of the differential operational amplifier 800 having the offset voltage correction function and an inverting output of the differential operational amplifier 101. The capacitor 112 is interposed between the inverting input and the noninverting output of the differential operational amplifier 800 having the offset voltage correction function. The capacitor 113 is interposed between the noninverting input and the inverting output of the same.

The differential operational amplifier 800 is the differential operational amplifier of the first embodiment of the present invention which can correct an offset voltage, and the amount of correction can be changed by setting conditions.

One of the inputs of the pulse width modulation circuit 120 (modulator) is connected to a noninverting output of the differential operational amplifier 800, and the other input of the pulse width modulation circuit 120 is connected to an inverting output of the differential operational amplifier 800 having the above-described offset voltage correction function.

The drive circuit 130 (output unit) comprises output buffers 131 and 132. An input of the output buffer 131 is connected to one output of the pulse width modulation circuit 120, and an output of this output buffer 131 is connected to a terminal B1 of the switch SWOUT 1 (signal passage controller) as well as to the output terminal T21. An input terminal of the switch SWOUT 1 is connected to an inverting input of the differential operational amplifier 800 by way of the feedback resistor R41 (feedback unit). An input of the output buffer 132 is connected to the other output of the pulse width modulation circuit 120, and an output of this output buffer 132 is connected to a terminal B2 of the switch SWOUT 2 (signal passage controller) as well as to the output terminal T22. The input terminal of the switch SWOUT 2 is connected to a noninverting input of the differential operational amplifier 800 by way of the feedback resistor R42 (feedback unit).

The output buffers 131 and 132 have an output impedance controller which enables changing of output impedance to a high level during correction of an offset voltage.

Terminals A1 and A2 of the switches SWOUT 1 and SWOUT 2 are connected commonly to one end of the offset voltage correction DC voltage source 160 (voltage application unit). The other end of the offset voltage correction DC voltage source 160 is grounded.

Two input terminals of the comparator 140 are connected to two output terminals of the differential operational amplifier 800 having an offset voltage correction function, respectively. An output terminal of the comparator 140 is connected to an input terminal of the control circuit 141, and an output terminal of the control circuit 141 is connected to a control terminal of the differential operational amplifier 800 having an offset voltage correction function.

An offset voltage correction circuit is formed from, among the above-described constituent elements, the switches SWOS 1, SWOS 2, SWOUT 1, SWOUT 2; the differential operational amplifier 800 having an offset voltage correction function, the offset voltage correction DC voltage source 160, the comparator 140, the control circuit 141, and an output impedance controller provided in the output buffers 131 and 132. The comparator 140 operates in the same fashion as does the comparator 900 of the first embodiment, and the control circuit 141 functions in the same manner as does the control circuit 809 of the first embodiment.

One end of an inductor L1 is connected to one output terminal T21, and the other end of the inductor L1 is connected to one input terminal of the speaker SP. The other output terminal T22 is connected to one end of an inductor L2, and the other end of the inductor L2 is connected to the other input terminal of the speaker SP. A capacitor C is interposed between the other end of the inductor L1 and the other end of the inductor L2. The inductors L1, L2 and the capacitor C constitute a low pass filter for eliminating a carrier frequency component, caused by pulse width modulation, from the signal output from the class D amplifier.

In the present embodiment, the source voltage of the output buffers 131 and 132 is assumed to be 15 V, and the source voltage of the differential operational amplifier 101 and the differential operational amplifier 800 having an offset voltage correction function is assumed to be 3.3 V.

Operation of the class D amplifier of the present embodiment is described while being classified into amplifying operation, operation for generating an offset voltage, and operation for correcting an offset voltage.

(1) Amplifying Operation

Amplifying operation (power amplifying operation) will first be described by reference to waveform diagrams shown in FIGS. 6A to 6C.

The analog input signal AIN(+) is applied from the signal source SIG to the input terminal T11 shown in FIG. 5, and the analog input signal (−) which is opposite in polarity to the analog input signal AIN(+) is applied to the other input terminal T12. These analog input signals AIN(+) and AIN(−) are input to the input stage differential amplifier 100 by way of the capacitors Cin 1 and Cin 2.

During amplifying operation, the switches SWOS 1 and SWOS 2 are closed, and the switches SWOUT 1 and SWOUT 2 are connected to the terminals B1 and B2, to thus form a feedback passage.

The input stage differential amplification circuit 100 amplifies a difference between the analog signal AIN(+) an the analog input signal AIN(−); outputs a positive phase signal of an amplified signal (a signal output from the noninverting output) SA from the noninverting output; and outputs a signal SB which is of a phase opposite to the amplified signal (a signal output from the inverting output) from the inverting output. The positive phase signal SA and the opposite phase signal SB are input to the integration circuit 110.

The integration circuit 110 integrates a difference between the signals SA and SB amplified by the input stage amplification circuit 100; outputs a positive phase signal SC of the difference (a signal output from the noninverting output) from the noninverting output; and outputs an opposite phase signal SD of the difference (a signal output from the inverting output) from the inverting output. The positive phase signal SC and the opposite phase signal SD are input to the pulse width modulation circuit 120.

The pulse width modulation circuit 120 compares the positive phase signal SC and the opposite phase signal SD output from the integration circuit 110 with a triangular waveform signal output from an unillustrated triangular waveform generation circuit, thereby outputting pulse width modulated pulse signals P and M. These pulse signals P and M are generated in such a way that a result of integration is reflected in the pulse width. Moreover, the pulse signals P and M are output from the drive circuit 130 as output pulse signals OUTP and OUTM by way of the output terminals T21 and T22. These output pulse signals OUTP and OUTM are returned through feedback to the differential operational amplifier 800 having an offset voltage correction function in the integration circuit 110 by way of the feedback resistors R41 and R42, and superimposed on a signal input to the integration circuit, thereby attempting to lessen a distortion in an output waveform.

In a state where no signal is input (hereinafter called a "no-signal-input state"), the difference between the positive phase signal SA and the opposite phase signal SB is zero. Accordingly, since a difference between a signal input to the inverting input of the differential operational amplifier 800 having an offset voltage correction function and a signal input to the noninverting input of the same is zero. Hence, the waveform of the positive phase signal SC coincides with the waveform of the opposite phase signal SD; namely, a difference between the positive phase signal SC and the opposite phase signal SD comes to zero. In a no-signal-input state, the relationship among the triangular waveform signal, the positive phase signal SA, and the opposite phase signal SB is set such that a duty ratio of the pulse signal P, that of the pulse signal M, that of the output pulse signal OUTP, and that of the output pulse signal OUTM assume 50%.

A high-level period (pulse width) of the pulse signal P and that of the pulse signal M depend on the level of the positive phase signal SA and the level of the opposite phase signal SB. The level of the positive phase signal SA and the level of the opposite phase signal SB depend on the signal level of the analog input signal AIN(+) and the level of the analog input signal AIN(−). Accordingly, the pulse width of the pulse signal P and that of the pulse signal M depend on the level of the analog input signal AIN(+) and the level of the analog input signal AIN(−), whereby pulse width modulation is realized.

Figure 6:
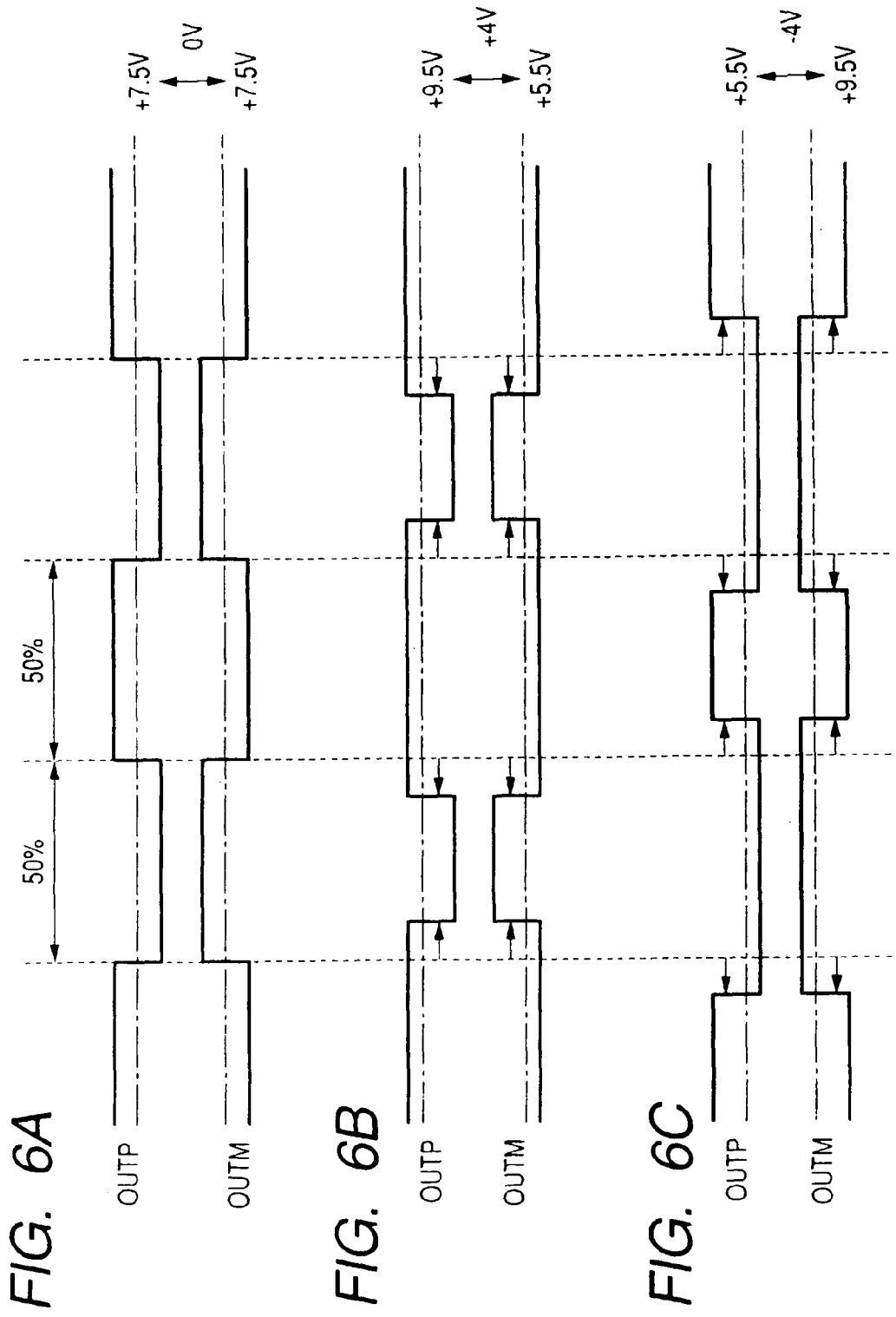
FIGS. 6A, 6B and 6C are waveform diagrams of the class D amplifier of the first embodiment.

In the no-signal-input state, the duty ratio of the output pulse signal OUTP is 50% as shown in FIG. 6A, and hence a mean level of the output pulse signal OUTP assumes a value of 7.5 V. Further, the duty ratio of the output pulse signal OUTM is also 50%, and hence a mean level of the output pulse signal OUTM also assumes a value of 7.5 V. Consequently, in the no-signal-input state, 7.5 V is applied to both input terminals of the speaker, and a potential difference between the input terminals is 0 V, and hence the speaker SP is not activated and no sound is emitted.

When the level of the analog input signal AIN(+) has increased from the no-signal-input state and when the level of the analog input signal AIN(−) having the opposite polarity has decreased, the high-level period of the output pulse signal OUTP is increased, and the low-level period of the output pulse signal OUTM is also increased. Namely, the duty ratio of the output pulse signal OUTP is increased, whereas the duty ratio of the output pulse signal OUTM is decreased.

In this case, the mean value of the output pulse signal OUTP comes to, e.g., 9.5 V, which is higher than 7.5 V achieved in the no-signal-input state, as shown in FIG. 6B. In contrast, the mean value of the output pulse signal OUTM comes to, e.g., 5.5 V, which is lower than 7.5 V achieved in the no-signal-input state. Consequently, a potential difference between the input terminals of the speaker SP comes to, e.g., 4 V (=9.5 V−5.5 V), and cone paper of the speaker SP is actuated, e.g., towards the front.

Conversely, when the level of the analog input signal AIN (+) has decreased from the above-mentioned no-signal-input state and when the level of the analog input signal AIN(−) has increased, the duty ratio of the output pulse signal OUTP is decreased as shown in FIG. 6C in the manner reverse to that mentioned previously, whereas the duty ratio of the output pulse signal OUTM is increased. Thus, a potential difference between the input terminals of the speaker SP comes to, e.g., −4 V (=5.5 V−9.5 V), and cone paper of the speaker SP is actuated backward.

As mentioned above, during normal amplifying operation, the duty ratio of the output pulse signal OUTP and the duty ratio of the output pulse signal OUTM are controlled in a complimentary manner in accordance with the levels of the analog input signals AIN, thereby generating a potential difference between the terminals of the speaker SP to thereby activate the speaker SP.

(2) Operation for Generating an Offset Voltage

Next will be described operation for generating an offset voltage. First, in relation to operation for generating an offset voltage in the no-signal-input state, a plurality of offset voltage generation sources are herein considered to exist independently of each other. Offset voltages from these sources are finally added together, and the sum of the offset voltages is assumed to be taken as an offset voltage of the entire class D amplifier.

Because of the offset voltage of the differential operational amplifier 101, a mean voltage of the signal SA and that of the signal SB assume values differing from a reference voltage of 1.65 V (one half of the source voltage) set by the in-phase feedback circuit. This offset voltage is multiplied by an amplification factor (R41/R31) of a negative feedback amplifier consisting of the feedback resistors R41 and R42, the integrator 110, the pulse width modulation circuit 120, and the output buffer 130, and appears as a potential difference (an offset voltage) between the output terminals T21 and T22.

Moreover, because of the offset voltage of the differential operational amplifier 800 having an offset voltage correction function, a mean voltage of the signal SC and a mean voltage of the signal SD assume values differing from a reference voltage of 1.65 V set by the in-phase feedback circuit.

Moreover, because of a difference between the resistance value of the feedback resistor R41 and the resistance value of the feedback resistor R42 or a difference between the resistance value of the input resistor R31 and the resistance value of the input resistor R32, an offset voltage arises in each of the output pulse signals OUTP and OUTM. A mean voltage of the output pulse signal OUTP and a mean voltage of the output pulse signal OUTM assume values differing from 7.5 V. The reason for this will be described hereunder.

As shown in FIG. 6A, in relation to the output pulse signals OUTP and OUTM achieved in the no-signal-input state, rectangular waveforms each having a duty ratio of 50% are complementarily output. Since the source voltage of the output buffer 130 is 15 V, no offset voltage exists in the differential operational amplifier. Under ideal conditions where all of positive phase and opposite phase resistance values are equal to each other, the mean voltage of the output pulse signal OUTP and the mean voltage of the output pulse signal OUTM are 7.5 V as mentioned previously.

Meanwhile, a mean voltage of the signal SA output from the differential operational amplifier 101 having a source voltage of 3.3 V and a mean voltage of the signal SB output from the same are 1.65 V, because the signals are returned through in-phase feedback so as to coincide with the reference voltage which is one half of the source voltage. Therefore, 5.85 V—which is a potential difference between the mean values of the output pulse signals OUTP and OUTM and the mean values of the output signals SA and SB—is applied to the feedback resistor R41, the input resistor R31 and the feedback resistor R42 of the integrator 110, and the input resistor R32 of the integrator 110, respectively. Consequently, an electric current corresponding to the sum of the resistance value of the feedback resistor R41 and the resistance value of the input resistor R31 flows from the output of the output buffer 130 into the positive phase output of the differential operational amplifier 101 by way of the feedback resistor R41 and the input resistor R31. Likewise, the electric current corresponding to the sum of the resistance value of the feedback resistor R42 and the resistance value of the input resistor R32 flows from the output of the output buffer 130 into the opposite phase output of the differential operational amplifier 101 by way of the feedback resistor R42 and the input resistor R32.

Consideration is now given to a case where a difference exists between the resistance value of the feedback resistor R41 and the resistance value of the feedback resistor R42. The voltages of the two inputs of the differential operational amplifier 800 having an offset voltage correction function are returned through feedback and hence are equal to each other. Accordingly, since the voltage applied across the input resistor R31 and the voltage applied across the input resistor R32 are equal to each other, the electric currents flowing through the respective input resistors R31 and R32 become equal to each other.

The electric currents having an equal value flow through the respective feedback resistors R41 and R42. Hence, even when the input resistors R31 and R32 are equal to each other in terms of a resistance value, a difference arises between voltage drops in the feedback resistors R41 and R42 at the output of the output buffer 1300. Therefore, an offset voltage corresponding to a difference between the resistance value of the feedback resistor R41 and the resistance value of the feedback resistor R42 arises in the output pulse signals OUTP and OUTM.

Likewise, when a difference exists between the resistance value of the input resistor R31 and the resistance value of the input resistor R32, an electric current corresponding to the difference between the resistance values flows into the feedback resistors R41 and R42. An offset voltage derived from the difference arises in the output pulse signals OUTP and OUTM and appears at the output terminals T21 and T22.

Specifically, when the amplification factor (R41/R31) of the positive phase side of the negative feedback amplifier constituting the class D amplifier and the amplification factor (R42/R32) of the opposite phase side of the same differ from each other for reasons of variations in resistance value, the difference appears as an offset voltage of an output.

Offset voltage generation sources other than the above-described typical three offset voltage generation sources exist. However, their explanations are omitted here.

All these offset voltages are combined together and appear at the output terminals T21 and T22. The speaker SP is activated by the offset voltages, which becomes a cause of emission of a popping sound at the time of a mute or power shutoff.

In the present invention, the offset voltages are corrected by an operation for correcting an offset voltage, which will be described below.

(3) Operation for Correcting Offset Voltage

The present invention is based on the basic principle that an offset voltage attributable to a difference in resistance value is caused to arise in the input of the differential operational amplifier by setting the voltage of a signal output from the output buffer (output unit) to a voltage to be returned through feedback by a feedback resistor (feedback unit) in the no-signal-input state, thereby correcting the offset voltage. One embodiment of the offset voltage correction operation will be described hereunder by reference to FIG. 7.

Figure 7:
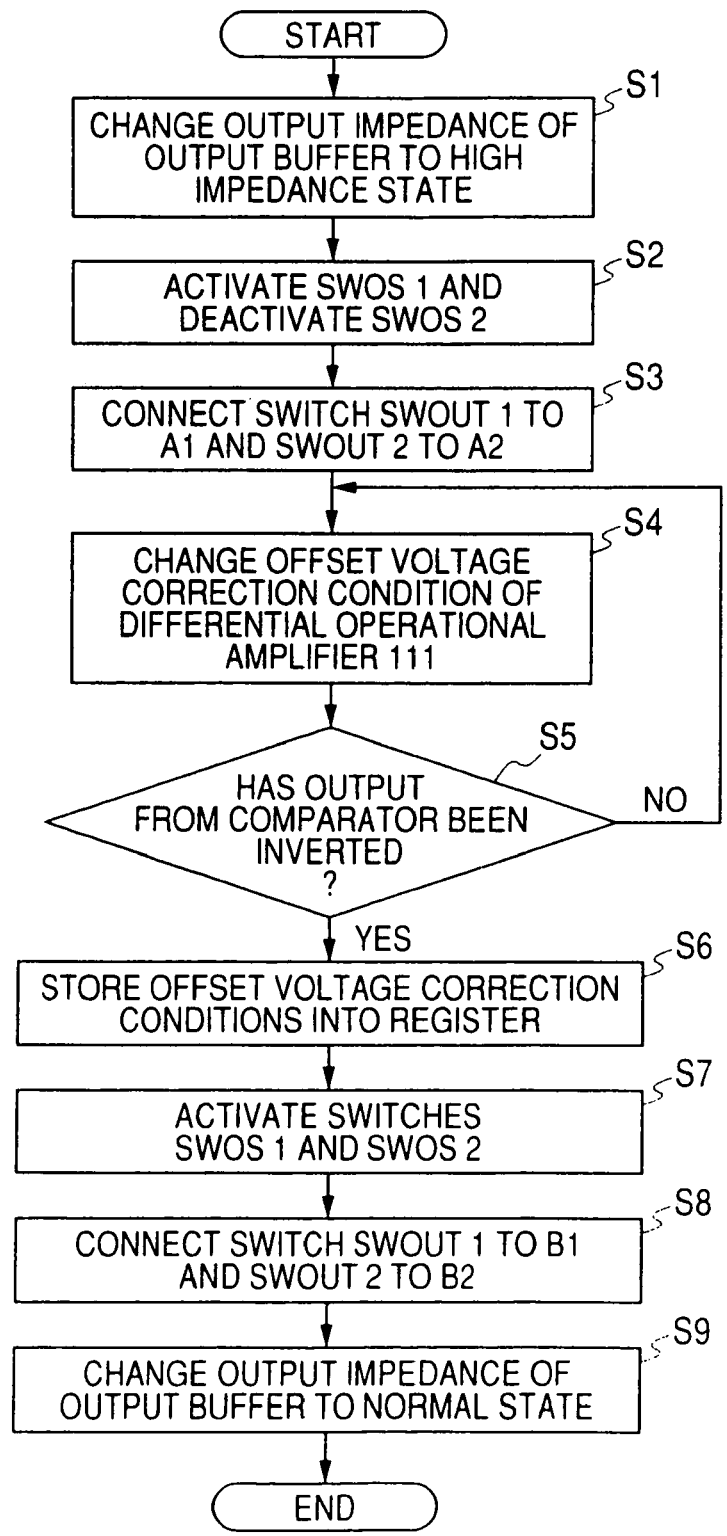
FIG. 7 is a flowchart showing a method for correcting an offset voltage of the class D amplifier of the first embodiment.

FIG. 7 is a flowchart showing a method for correcting an offset voltage.

An unillustrated control circuit controls output impedances of the output buffers 131 and 132 so as to enter a high impedance state by controlling output impedances of the output buffers 131 and 132 (step S1).

Next, the unillustrated control circuit deactivates the switches SWOS 1 and SWOS 2 connected to the input of the differential operational amplifier 101, thereby blocking an input signal from the outside and setting a no-signal-input state (step S2). Thereby, even when an input signal is input to the input terminals T11 and T12, an offset voltage can be corrected in that state.

Next, the unillustrated control circuit connects the switch SWOUT 1 to the terminal A1 and the switch SWOUT 2 to the terminal A2, thereby opening the feedback passage (step S3). As a result, the connection between the output terminal of the output buffer 131 and the feedback resistor R41 and the connection between the output terminal of the output buffer 132 and the feedback resistor R42 are opened. One end of each of the feedback resistors R41 and R42 is connected commonly to the offset voltage correction DC voltage source 160.

In these steps S1 through S3, the feedback passages are opened, and the offset voltage correction DC voltage source 160 applies a DC voltage to one end of each of the feedback resistors R41 and R42. The value of this voltage is set to a voltage (7.5 V, which is one half of the source voltage 15 V, in the present embodiment) equal to an average of the output pulse signals OUTP and OUTM achieved in a no-signal-input state during normal operation (a voltage to be returned through feedback).

Consequently, one end of each of the feedback resistors R41 and R42 is set to the same bias conditions as those employed in the actual no-signal-input state where the feedback passage has been created. As mentioned previously, when a difference exists in resistance value, a difference arises in the values of electric currents flowing through the positive phase side and the opposite phase side of the resistor. An offset voltage arises in the inverting input and the noninverting input of the differential operational amplifier 800 having an offset voltage correction function.

Specifically, since a voltage of 5.85 [V] (=7.5−1.65) is applied to the feedback resistor R41 and the input resistor R31, a voltage [1.65+5.85×R31/(R31+R41) V] is applied to the opposite phase input of the differential operational amplifier 800 having an offset voltage correction function. Likewise, a voltage [1.65+5.85×R32/(R32+R42) V] is applied to the positive phase input of the differential operational amplifier 800 having an offset voltage correction function. As can be seen from both expressions, a potential difference (i.e., an offset voltage) corresponding to a difference among the resistance values of the input resistors R31, R32 and the resistance values of the feedback resistors R41, R42 occurs in the input of the differential operational amplifier 800 having an offset voltage correction function. The amount of offset voltage is equivalent to the amount of offset voltage occurring in the no-signal-input state during normal operation where the feedback passage is created.

In addition, the offset voltage of the differential operational amplifier 101 arises in the input of the differential operational amplifier 800 having an offset voltage correction function.

Further, the offset voltage belonging to the differential operational amplifier 800 having an offset voltage correction function arises in the input as an input-equivalent offset voltage.

Consequently, the offset voltage attributable to all of the previously-described factors collectively appears in the input of the differential operational amplifier 800 having an offset voltage correction function. The offset voltage is amplified by an amplification factor of the differential operational amplifier 800 having an offset voltage correction function, and is output to the output signals SC and SD.

Therefore, all of the above-described offset voltages are corrected concurrently as a result of the differential operational amplifier 800 with an offset voltage correction function performing offset voltage correction operation.

The voltage of the offset voltage correction voltage source 160 is not limited solely to the above voltage but may also be arbitrarily set.

The control circuit 141 changes offset voltage correction conditions of the differential operational amplifier 800 having an offset voltage correction function (step S4). As a result, the differential operational amplifier 800 having an offset voltage correction function generates a predetermined offset voltage determined by the offset voltage correction conditions.

Now, when the differential operational amplifier 800 having an offset voltage correction function generates an offset voltage which is opposite in polarity to and equal in magnitude to the offset voltage induced by the class D amplifier, the potential difference between the output signals SC and SD is eliminated. Hence, optimum offset voltage correction becomes feasible, so long as the potential difference is detected.

The control circuit 141 determines whether or not the level of the signal Comp output from the comparator 140 has become inverted from the initial state. When the signal level has not become inverted, the amount of offset voltage and the polarity are determined to be inappropriate. For these reasons, processing returns to step S4, and the offset voltage correction conditions are changed (No in step S5). When the level of the signal Comp output from the comparator 140 has become inverted, this indicates that the offset voltage has become sufficiently small under the offset voltage correction conditions, and hence processing proceeds to step S6 (Yes in step S5).

Alternatively, a determination may also be made, without use of the comparator 140, as to whether or not the level of one output signal (e.g., the signal SC) of the differential operational amplifier 800 having an offset voltage correction function has become inverted.

The control circuit 141 stores the offset voltage correction conditions into a register (step S6). During ordinary amplifying operation, the offset voltage is corrected by use of the offset voltage correction conditions stored in this register.

An unillustrated control circuit activates the switches SWOS 1 and SWOS 2 (step S7). The unillustrated control circuit connects the switch SWOUT 1 to B1 and the switch SWOUT 2 to B2 (step S8).

Finally, the unillustrated control circuit cancels the output impedance of the output buffer from the high impedance state, and changes the output impedance to a normal state (step S9). The class D amplifier becomes able to perform ordinary amplifying operation through steps S7 to S9.

As a result of performance of the above-described offset voltage correction method, there can be performed correction of an offset voltage including the offset voltage of the differential operational amplifier 101 and the offset voltage of the differential operational amplifier 800 having an offset voltage correction function as well as the offset voltage attributable to a difference in the resistance values of the input resistors R31, R32 and the resistance values of the feedback resistors R41, R42. Specifically, use of this configuration enables simultaneous correction of the offset voltage of the entire class D amplifier through single offset voltage correction operation. Further, since a single differential operational amplifier having an offset voltage correction function can correct an offset voltage, complication of a circuit configuration is avoided, and an increase in area can also be suppressed.

The configuration of the differential operational amplifier 800, the offset voltage correction operation, the offset voltage setting operation, and the method for correcting an offset voltage, all of which are used in the class D amplifier of the present embodiment, are the same as those employed in the differential operational amplifier 800 of the first embodiment, and hence their explanations are omitted.

Use of the differential operational amplifier having the offset voltage correction function, such as that mentioned above, enables implementation of the class D amplifier of the present embodiment.

Third Embodiment

In the present embodiment, a class D amplifier whose configuration is different from that described in connection with the second embodiment corrects an offset voltage. Specifically, an example class D amplifier using another circuit as the pulse width modulation circuit 120 is shown.

Figure 8:
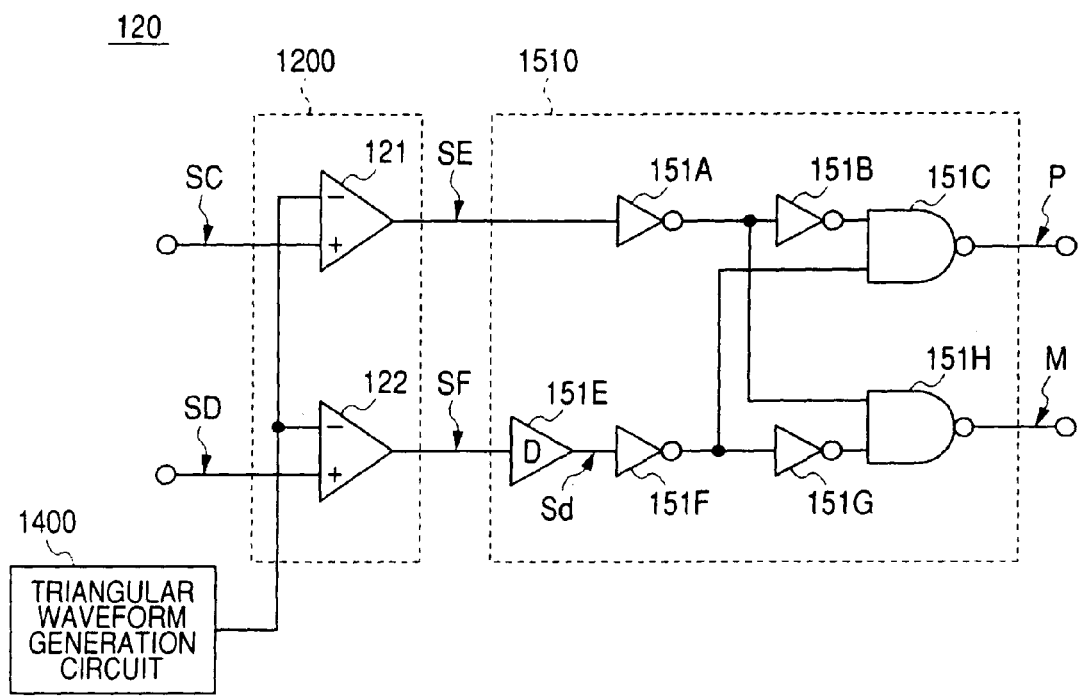
FIG. 8 is a circuit diagram of a pulse width modulation circuit used in a class D amplifier of a third embodiment of the present invention.

FIG. 8 is a circuit diagram of a pulse width modulation circuit used in the class D amplifier of the third embodiment of the present invention.

The class D amplifier (having the same configuration as that of the class D amplifier shown in FIG. 5) configured by use of the pulse width modulation circuit shown in the drawing is a so-called filterless class D amplifier. The amplifier is configured so as to output a signal of predetermined level from one of two output terminals in accordance with the level of the analog input signal AIN from the external signal source SIG; and to compare a triangular waveform signal with the signal level, thereby generating and outputting, from the other output terminal, the pulse signals OUTP and OUTM obtained by pulse-width modulating the analog input signal.

The configuration of the pulse width modulation circuit used in the class D amplifier of the present embodiment will now be described in detail. The pulse width modulation circuit 120 comprises a pulse width modulation section 1200, a triangular waveform generation circuit 1400, and a signal conversion section 1510.

The pulse width modulation section 1200 comprises comparators 121 and 122. A noninverting input of the comparator 121 of these comparators is connected to a noninverting output of the differential operational amplifier 111 having an offset voltage correction function, and a noninverting input of the comparator 122 is connected to an inverting output of the differential operational amplifier 111 having an offset voltage correction function. A triangular waveform signal (a triangular waveform signal having a constant cycle and a constant peak-to-peak value) is input commonly to respective inverting inputs of these comparators 121 and 122 from the triangular waveform generation circuit 1400.

The signal conversion section 1510 comprises inverters 151A, 151B, 151F, 151G, a delay section 151E, and NOR gates 151C and 151H.

A pulse signal SE is imparted from the previously-described pulse width modulation section 1200 to an input of the inverter 151A, and an output of the inverter 151A is connected to an input of the inverter 151B. An output of the inverter 151B is connected to one of inputs of the NOR gate 151C.

A pulse signal SF is imparted from the previously-described pulse width modulation section 1200 to an input of the delay section 151E, and an output of this delay section 151E is connected to an input of the inverter 151F. An output of this inverter 151F is connected to an input of the inverter 151G. An output of the inverter 151G is connected to one input of the NOR gate 151H. The other input of the NOR gate 151C is connected to an output of the inverter 151F, and the other input of the NOR gate 151H is connected to an output of the inverter 151A.

Operation of the class D amplifier of the present embodiment will now be described.

(1) No-Signal-Input State

When the level of the analog input signal AIN is 0 V; namely, in a no-signal-input state, the waveform of the positive phase signal SC coincides with the waveform of the opposite phase signal SD. Further, a relationship among the triangular waveform signal, the positive phase signal SC, and the opposite phase signal SD is set such that the duty ratio of the pulse signal SE and that of the pulse signal SF assume a value of 50%.

First, amplifying operation is described.

Operation of the class D amplifier other than operation of the pulse width modulation circuit is identical with that described in connection with the second embodiment, and hence its description is omitted.

The comparators 121 and 122 of the pulse width modulation section 1200 compare the positive phase signal SC and the opposite phase signal SD output from the integration circuit 110 with the triangular waveform signal output from the triangular waveform generation circuit 1400, whereby the pulse width modulated pulse signals SE and SF are output to a signal conversion section 1510.

The high-level period (pulse width) of the pulse signal SE and the high-level period of the pulse signal SF depend on the level of the positive phase signal SA and the level of the opposite phase signal SB. The level of the positive phase signal SA and the level of the opposite phase signal SB depend on the level of the analog input signal AIN(+) and the level of the analog input signal AIN(−). Accordingly, the pulse width of the pulse signal SE and the pulse width of the pulse signal SF depend on the level of the analog input signal AIN(+) and the level of the analog input signal AIN(−). Thus, pulse width modulation is realized.

Subsequently, operation of the signal conversion section 1510 is described. Generally, the signal conversion section 1510 converts the pulse signals SE and SF into pulse signals P and M which complementarily enter a low level (a predetermined level) in accordance with the level of the analog input signal AIN. The pulse signal SE is imparted to one input of the NOR gate 151C by way of the inverters 151A and 151B. After having been delayed for a given period of time by the delay section 151E, the pulse signal SF is output from the delay section 151E as a pulse signal Sd. This pulse signal SD is inverted by an inverter 151F and imparted to the other input of the NOR gate 151C as well as to the other input of the NOR gate 151H by way of the inverters 151F and 151G.

When first input conditions where the pulse signal SE is of a high level and the pulse signal SD is of a low level are satisfied, the NOR gate 151C outputs a low level to the output buffer 131. Meanwhile, when second input conditions (i.e., input conditions complementary to the first input conditions) where the pulse signal SE is of a low level and the pulse signal SD is of a high level are satisfied, the NOR gate 151H outputs a low level to the output buffer 132.

In the present embodiment, the first input conditions are set as a specific combination of the level of the pulse width modulated pulse signal SE with the level of the pulse width modulated pulse signal SD when the polarity of the level of the analog input signal AIN(+) is positive. The second input conditions are set as a specific combination of the level of the pulse width modulated pulse signal SE with the pulse width modulated pulse signal SD when the polarity of the level of the analog input signal AIN(+) is negative.

The first and second input conditions which are complementary to each other are set as mentioned above, whereby the pulse width modulated pulse signals SE and SF can be converted into signals P and M which are complementarily fixed to a low level. However, the first and second input conditions are not limited to this example. The first and second input conditions can be set arbitrarily, so long as a combination of signal levels correspond to a change in the pulse width of the pulse signal SE and a change in the pulse width of the pulse signal SD which are attributable to pulse width modulation.

In the no-signal-input state, the period during which the first input conditions are satisfied is a constant period from when the pulse signal SE has shifted to a high level until when the pulse signal SD shifts to a high level. This period corresponds to a delay time tD consumed by the delay section 151E. Further, the period during which the second input conditions are satisfied is a constant period from when the pulse signal SE has shifted to a low level until when the pulse signal SD shifts to a low level. This period also corresponds to the delay time tD consumed by the delay section 151E. Eventually, when no signal is input, the signal conversion section 1510 converts the pulse signals SC and SD into pulse signals of shorter pulse width (e.g., a duty ratio of 10%) corresponding to the delay time tD, and intermittently outputs the pulse signals at the cycle of the triangular waveform signal.

Figure 9:
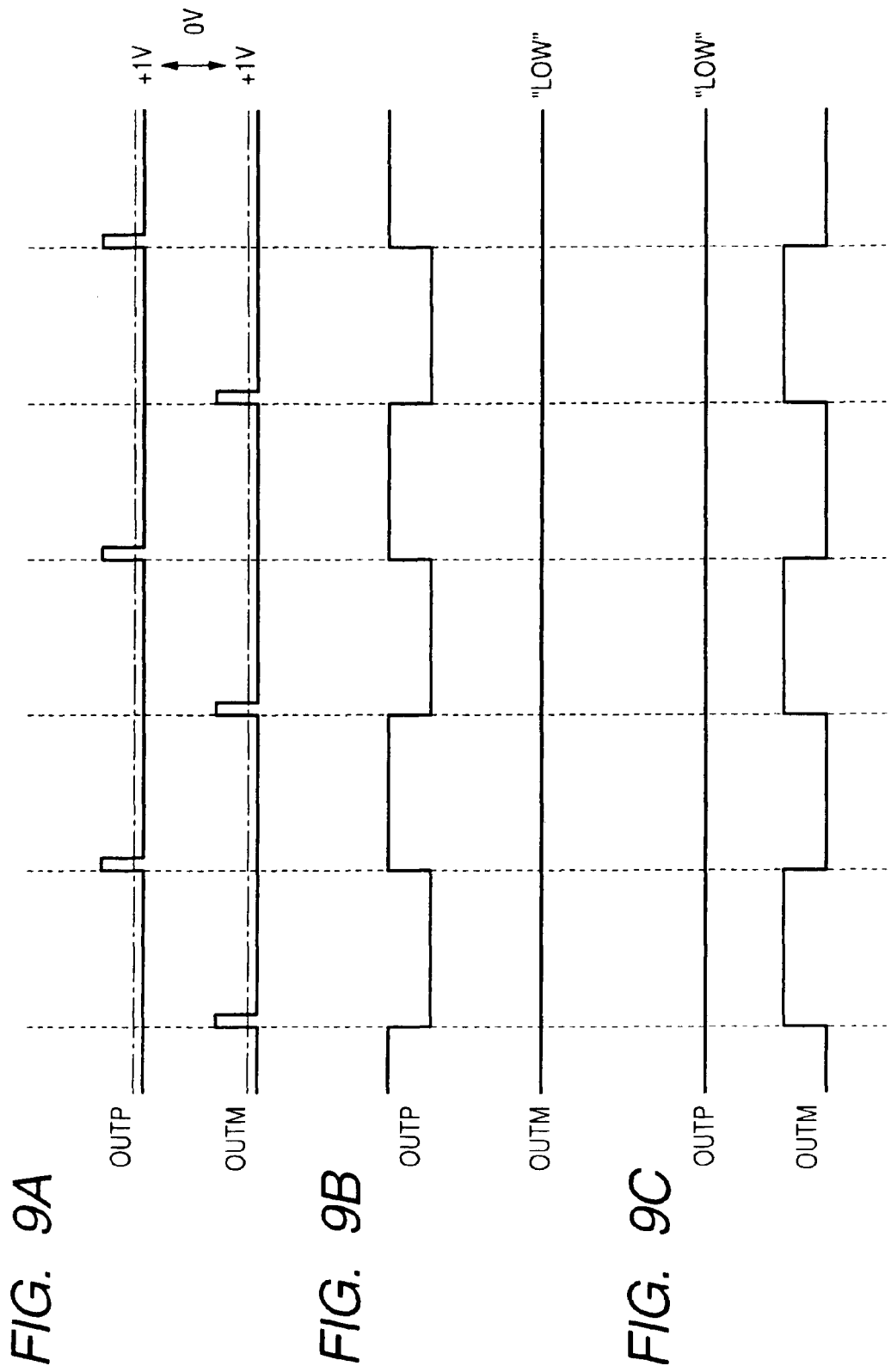
FIGS. 9A, 9B and 9C are waveform diagrams of the class D amplifier of the second embodiment.
Figure 10:
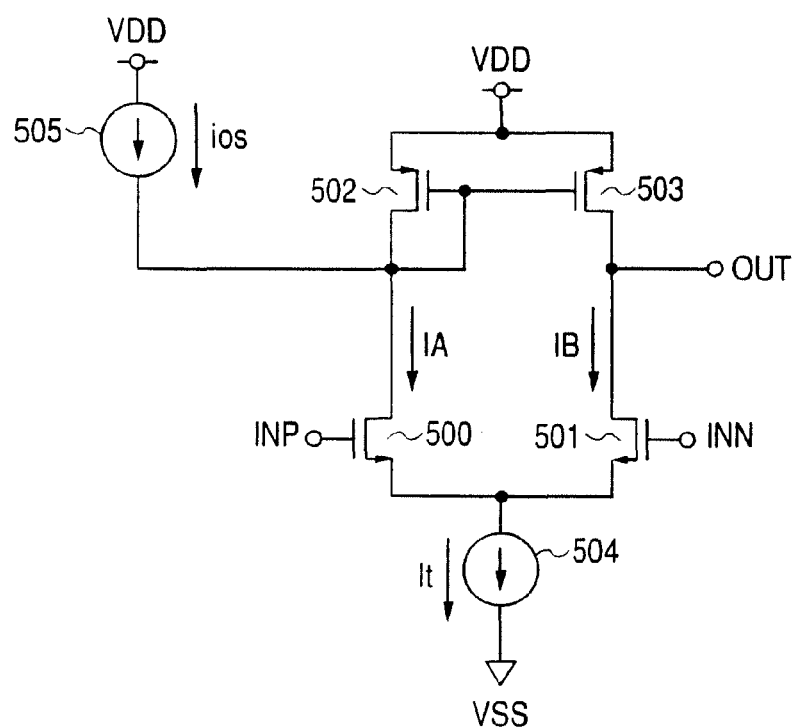
FIG. 10 is a circuit diagram of a differential-operation amplifier equipped with an offset voltage correction circuit of the related art.

In short, the pulse signal P output from the previously-described NOR gate 151C and the pulse signal M output from the NOR gate 151H are input to the output buffers 131 and 132, respectively. The pulse signals are then inverted as shown in FIG. 9A and output as the output pulse signals OUTP and OUTM, thereby activating the speaker.

(2) Signal Input State

In a state where the level of the analog input signal AIN(+) remains decreased and the level of the analog input signal AIN(−) of opposite polarity remains increased, the level of the positive phase signal SC output from the integration circuit 110 is increased, and the level of the opposite phase signal SD decreases, and the level of the positive phase signal SC exceeds the level of the opposite phase signal SD. The delay time of the delay section 151E is ignored.

Consequently, the duty ratio of the pulse signal SE increases, and the duty ratio of the pulse signal SF decreases. Therefore, the second input conditions are not satisfied, and hence the output pulse signal OUTM is fixed to a low level as shown in FIG. 9B. Moreover, the pulse width of the output pulse signal OUTP is modulated in accordance with the levels of the analog input signals AIN.

Meanwhile, in a state where the level of the analog input signal AIN(+) remains increased and the level of the analog input signal AIN(−) of opposite polarity remains decreased, the level of the positive phase signal SC output from the integration circuit 110 is decreased, and the level of the opposite phase signal SD increases, and the level of the opposite phase signal SD exceeds the level of the positive phase signal SC. The delay time of the delay section 151E is ignored.

Consequently, the duty ratio of the pulse signal SE output from the pulse width modulation section 1200 decreases, and the duty ratio of the pulse signal SF increases. Therefore, the first input conditions are not satisfied, and hence the output pulse signal OUTP is fixed to a low level as shown in FIG. 9C. Moreover, the pulse width of the output pulse signal OUTM is modulated in accordance with the levels of the analog input signals AIN.

As mentioned above, during normal amplifying operation, one of the output pulse signals OUTP and OUTM is fixed to a low level according to the analog input signals, and a remaining output pulse signal includes a pulse whose width has been modulated. When such output pulse signals OUTP and OUTM are supplied to the speaker, a potential difference arises between the input terminals of the speaker, and the speaker is activated.

Thus, the class D amplifier of the present embodiment can act as a so-called filterless amplifier capable of activating a speaker without use of a low pass filter connected to the output terminals T21 and T22 of the class D amplifier.

Next, an operation for generating an offset voltage will be described.

Even in the class D amplifier of the present embodiment, an offset voltage arises on the same principle as that described in connection with the second embodiment. A mean value of each of the output pulse signal OUTP and the output pulse signal OUTM, which is achieved in the no-signal-input state of the present embodiment, depends on a pulse width and is, for example, about 1 V. In contrast, a mean voltage of each of the signals SA and SB is 1.65 V and, hence, an electric current corresponding to the potential difference flows into the input resistors R31 and R32 and the feedback resistors R41 and R42. Consequently, when a difference exists between the resistance value of the positive phase side and the resistance value of the opposite phase side of the resistor, an offset voltage arises in an output.

Even in the present embodiment, the operation for correcting an offset voltage is the same as that described in connection with the second embodiment and performed according to the flowchart shown in FIG. 7. Consequently, an offset voltage of the differential operational amplifier and an offset voltage attributable to the difference between the resistance value of the positive phase side and the resistance value of the opposite phase side of the resistor can also be corrected concurrently.

Advantages of the second and third embodiments are summarized below.

According to the embodiments described thus far, an offset voltage, which arises when a difference of resistance value exists in the input resistors and between the positive phase side and the negative phase side of the feedback resistor in the amplifier of this type, can be effectively corrected by addition of an extremely simple configuration (the switches SWOS 1, SWOS 2, SWOUT 1, SWOUT 2, the differential operational amplifier 111 having an offset voltage correction function, an output impedance controller of the output buffers 131 and 132, the comparator 140, the control circuit 141, and the offset voltage correction DC voltage source 160).

The offset voltage of the differential operational amplifier as well as the above-mentioned offset voltage can be corrected concurrently by single offset voltage correction operation.

Moreover, since the switches SWOS 1 and SWOS 2 are deactivated, the offset voltage can be corrected even when the input signal is being input.

The embodiments of the present invention have been described in detail above. However, the specific configuration is not limited to the embodiments, and design modifications, or the like, falling within the scope of gist of the present invention are also included. For instance, the differential operational amplifier having an offset voltage correction function may have any circuit configuration, and is not limited to the circuit shown in FIG. 2. Moreover, the class D amplifier may also have any configuration. Furthermore, the voltage of the offset voltage correction DC voltage source is not limited to a mean voltage of the output pulse signal achieved when no signal is input, but may be, e.g., 0 V (a ground potential) or an arbitrary voltage.

What is claimed is:

1. A class D amplifier comprising:
   an input unit that inputs an input signal;
   an integrator which includes a differential operational amplifier having an offset voltage correction function and integrates the input signal input through the input unit;
   a pulse-width modulator that modulates an integration result of the integrator, to generate a pulse signal having pulse width that reflects the integration result;
   an output unit that outputs the pulse signal;
   a feedback unit that superimposes a signal output from the output unit on the input signal and feeds back the superimposed signal to the integrator;
   an input controller that selectively sets the input unit to a state where no signal is input; and
   an output controller which sets a voltage of an output from the feedback unit to a constant voltage.

2. The class D amplifier according to claim 1, wherein the constant voltage set by the output controller corresponds to a voltage output from the output unit in the state where no signal is input and where an offset voltage of the differential amplifier is corrected.

3. The class D amplifier according to claim 1, wherein the output controller comprise:
   an output impedance controller that controls an output impedance of the output unit to a high impedance state;
   a voltage application unit that applies the constant voltage to the feedback unit; and
   a signal passage controller that opens a connection between an output terminal of the output unit and one end of the feedback unit and connects the one end of the feedback unit to the voltage application unit.

4. The class D amplifier according to claim 1, wherein the input controller includes a switch connected between an input resistor of the input unit and an input of the differential operational amplifier.

5. The class D amplifier according to claim 1, wherein the pulse signal generated by the pulse-width modulator correspond to first and second pulse signals having duty ratios which change in a complementary manner according to the integration result of the integrator, and wherein the output unit outputs the first and second pulse signals respectively.

6. The class D amplifier according to claim 1, wherein the pulse-width modulator generates a fixed signal having a predetermined fixed level as well as the pulse signal and supplies the fixed signal and the pulse signal to the output unit.

* * * * *